(12) United States Patent
Hallack et al.

(10) Patent No.: US 10,189,408 B2
(45) Date of Patent: Jan. 29, 2019

(54) DISPLAY MIRROR ASSEMBLY INCORPORATING HEATSINK

(71) Applicant: Gentex Corporation, Zeeland, MI (US)

(72) Inventors: Jason D. Hallack, Allendale, MI (US); Danny L. Minikey, Jr., Fenwick, MI (US); Michael F. Lisowski, Holland, MI (US); Richard T. Fish, Jr., Hudsonville, MI (US)

(73) Assignee: GENTEX CORPORATION, Zeeland, MI (US)

( * ) Notice: Subject to any disclaimer, the term of this patent is extended or adjusted under 35 U.S.C. 154(b) by 64 days.

(21) Appl. No.: 15/340,313

(22) Filed: Nov. 1, 2016

(65) Prior Publication Data
US 2017/0120824 A1    May 4, 2017

Related U.S. Application Data

(60) Provisional application No. 62/249,706, filed on Nov. 2, 2015.

(51) Int. Cl.
*B60R 1/04* (2006.01)
*B60R 1/08* (2006.01)
(Continued)

(52) U.S. Cl.
CPC .......... *B60R 1/04* (2013.01); *B60R 1/087* (2013.01); *B60R 1/088* (2013.01); *B60R 1/12* (2013.01);
(Continued)

(58) Field of Classification Search
CPC .. B60R 1/04; B60R 1/12; B60R 1/088; B60R 1/087; B60R 2001/1215; G02B 6/0088;
(Continued)

(56) References Cited

U.S. PATENT DOCUMENTS

| 3,740,122 A | 6/1973 | Stern |
| 5,928,572 A | 7/1999 | Tonar et al. |
| 5,998,617 A | 12/1999 | Srinivasa et al. |
| 6,020,987 A | 2/2000 | Baumann et al. |
| 6,037,471 A | 3/2000 | Srinivasa et al. |
| 6,137,620 A | 10/2000 | Guarr et al. |
| 6,141,137 A | 10/2000 | Byker et al. |

(Continued)

FOREIGN PATENT DOCUMENTS

| WO | 9842796 A1 | 10/1998 |
| WO | 9902621 A1 | 1/1999 |
| WO | 2006014209 A2 | 2/2006 |

OTHER PUBLICATIONS

International Search Report and Written Opinion of the International Searching Authority, or the Declaration, dated Mar. 6, 2017, for International Application No. PCT/US2016/059887, filed Nov. 1, 2016, 8 pages.

*Primary Examiner* — Joseph L Williams
*Assistant Examiner* — Jose M Diaz
(74) *Attorney, Agent, or Firm* — Price Heneveld LLP; Bradley D. Johnson

(57) ABSTRACT

A display mirror assembly for a vehicle is disclosed. The assembly comprises a display device defining a display surface having a display perimeter elongated along a length. The display device is in communication with a primary PCB. The primary PCB comprises a first side and an opposing second side. The first side is directed toward the display device. The assembly also comprises a heat sink in connection with the second side of the primary PCB and extending substantially coextensive with the length display perimeter.

20 Claims, 19 Drawing Sheets

(51) Int. Cl.
  *B60R 1/12*    (2006.01)
  *F21V 23/04*   (2006.01)
  *F21V 8/00*    (2006.01)
  *H05K 1/18*    (2006.01)
  *H05K 5/00*    (2006.01)
  *H05K 5/02*    (2006.01)
  *H05K 9/00*    (2006.01)
  *H05K 1/02*    (2006.01)

(52) U.S. Cl.
  CPC ........ *F21V 23/0464* (2013.01); *G02B 6/0068* (2013.01); *G02B 6/0085* (2013.01); *G02B 6/0088* (2013.01); *H05K 1/181* (2013.01); *H05K 5/0017* (2013.01); *H05K 5/0204* (2013.01); *H05K 9/0081* (2013.01); *B60R 2001/1215* (2013.01); *H05K 1/0203* (2013.01); *H05K 2201/10128* (2013.01); *H05K 2201/10151* (2013.01)

(58) Field of Classification Search
  CPC .. G02B 6/0068; G02B 6/0085; G02B 6/0001; F21V 23/0464; H05K 1/0203; H05K 5/0017; H05K 5/0204; H05K 9/0081; H05K 2201/10128; H05K 2201/10151; G02F 1/133615; G02F 1/1336; B60Q 1/00; B60Q 3/002; B60Q 3/04; F21Y 2103/003
  See application file for complete search history.

(56) References Cited

U.S. PATENT DOCUMENTS

| | | |
|---|---|---|
| 6,193,912 B1 | 2/2001 | Thieste et al. |
| 6,241,916 B1 | 6/2001 | Claussen et al. |
| 6,249,369 B1 | 6/2001 | Theiste et al. |
| 6,519,072 B2 | 2/2003 | Nishikitani et al. |
| 6,569,361 B1 | 5/2003 | Berneth et al. |
| 8,201,800 B2 | 6/2012 | Filipiak |
| 8,210,695 B2 | 7/2012 | Roth et al. |
| 8,264,761 B2 | 9/2012 | Cammenga et al. |
| 8,643,931 B2 | 2/2014 | Cammenga et al. |
| 8,646,924 B2 | 2/2014 | Roth et al. |
| 8,814,373 B2 | 8/2014 | Steel et al. |
| 8,827,517 B2 | 9/2014 | Cammenga et al. |
| 8,836,888 B2 | 9/2014 | Minikey, Jr. et al. |
| 2004/0196577 A1 | 10/2004 | Carter et al. |
| 2005/0270620 A1 | 12/2005 | Bauer et al. |
| 2008/0068520 A1* | 3/2008 | Minikey, Jr. .............. B60R 1/12 349/11 |
| 2009/0096937 A1* | 4/2009 | Bauer ...................... B60R 1/12 348/739 |
| 2009/0201137 A1 | 8/2009 | Weller et al. |
| 2012/0327234 A1 | 12/2012 | Fish, Jr. et al. |
| 2013/0062497 A1 | 3/2013 | Van Huis et al. |
| 2013/0187017 A1 | 7/2013 | Roth |
| 2013/0194650 A1 | 8/2013 | Roth et al. |
| 2014/0063630 A1 | 3/2014 | Busscher et al. |
| 2014/0091123 A1 | 4/2014 | Kim et al. |
| 2014/0268355 A1 | 9/2014 | Lee et al. |
| 2015/0085337 A1 | 3/2015 | Lee et al. |

* cited by examiner

DISPLAY MIRROR ASSEMBLY INCORPORATING HEATSINK

BACKGROUND OF THE INVENTION

The present invention generally relates to a rearview device system, and more particularly, a display mirror assembly having a partially reflective, partially transmissive element and a display behind the reflective element.

SUMMARY OF THE INVENTION

One aspect of the disclosure includes a display mirror assembly for a vehicle is disclosed. The assembly comprises a display device defining a display surface having a display perimeter elongated along a length. The display device is in communication with a primary PCB. The primary PCB comprises a first side and an opposing second side. The first side is directed toward the display device. The assembly also comprises a heat sink in connection with the second side of the primary PCB and extending substantially coextensive with the length display perimeter.

Another aspect of the disclosure includes a display mirror assembly for a vehicle is disclosed. The assembly comprises a display device comprising an optic tray and an optic block defining a display surface having a display perimeter elongated along a length. The assembly further comprises a primary PCB in communication with the display device. The primary PCB comprises a first side and an opposing second side, wherein the first side is directed toward the display device. The assembly further comprises a lighting module and a heat sink. The lighting module is configured to project light along the length of the optic block substantially parallel to the display surface. The heat sink is in connection with the second side of the primary PCB and extends substantially coextensive with the length of the optic block.

Yet another aspect of the disclosure includes a display mirror assembly for a vehicle is disclosed. The assembly comprises a display device comprising an optic tray and an optic block defining a display surface having a display perimeter elongated along a length. The assembly further comprises a primary PCB in communication with the display device. The primary PCB comprises a first side and an opposing second side, wherein the first side directed toward the display device. The primary PCB is in communication with the display device via a communication cable. The assembly further comprises a lighting module and a heat sink. The lighting module is configured to project light along a length of the optic block parallel to the display surface. The heat sink is in connection with the second side of the primary PCB and forms an aperture configured to pass the communication cable therethrough. The heat sink is configured to structurally support the display mirror assembly via a connection with a mounting bracket.

These and other features, advantages, and objects of the present invention will be further understood and appreciated by those skilled in the art by reference to the following specification, claims, and appended drawings.

DETAILED DESCRIPTION

Figure 1:
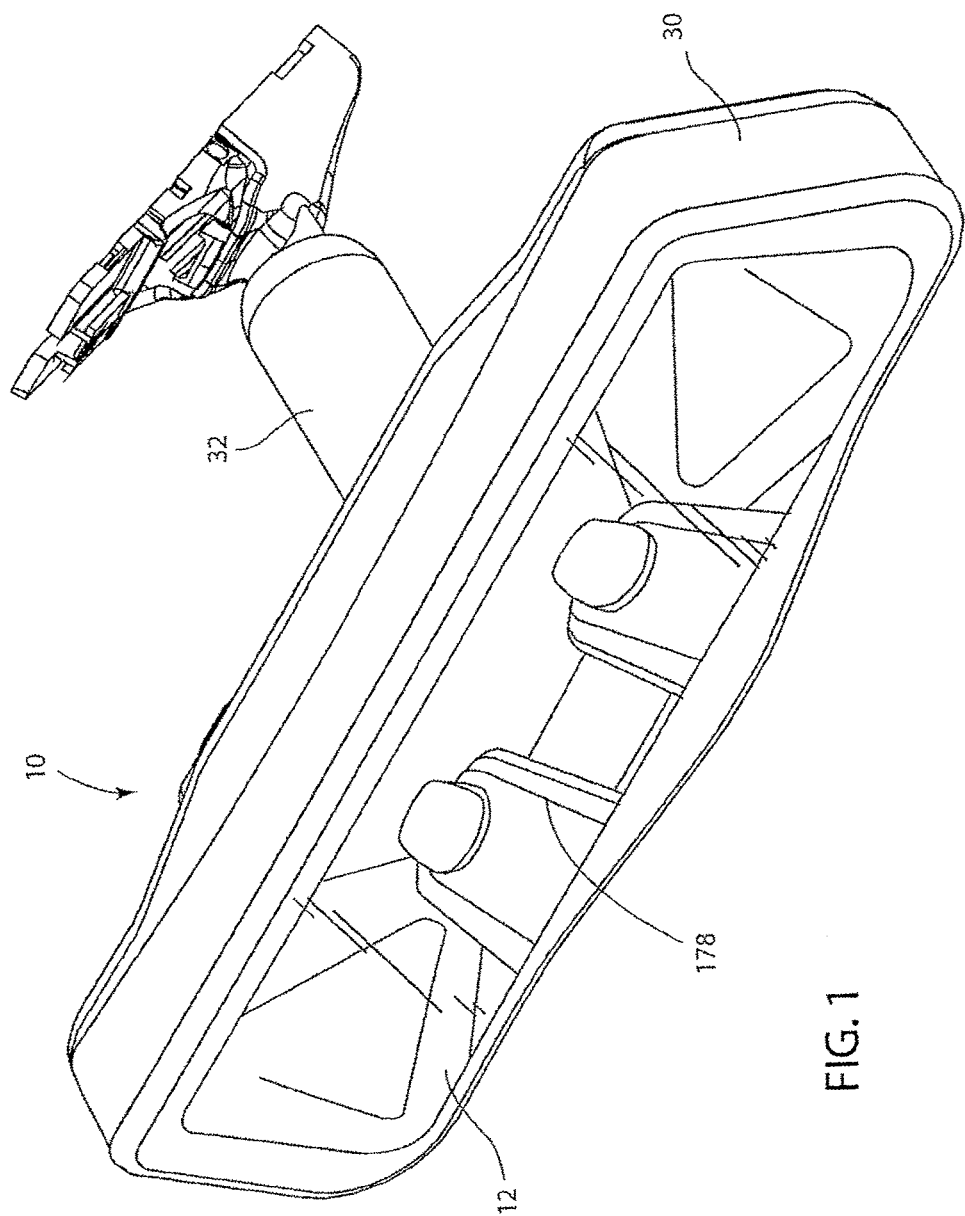
FIG. 1 is a top front perspective view of a display mirror assembly for a vehicle.

The present illustrated embodiments reside primarily in combinations of method steps and apparatus components related to a display mirror. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the element closer to an intended viewer of the display mirror, and the term "rear" shall refer to the surface of the element further from the intended viewer of the display mirror. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Figure 2:
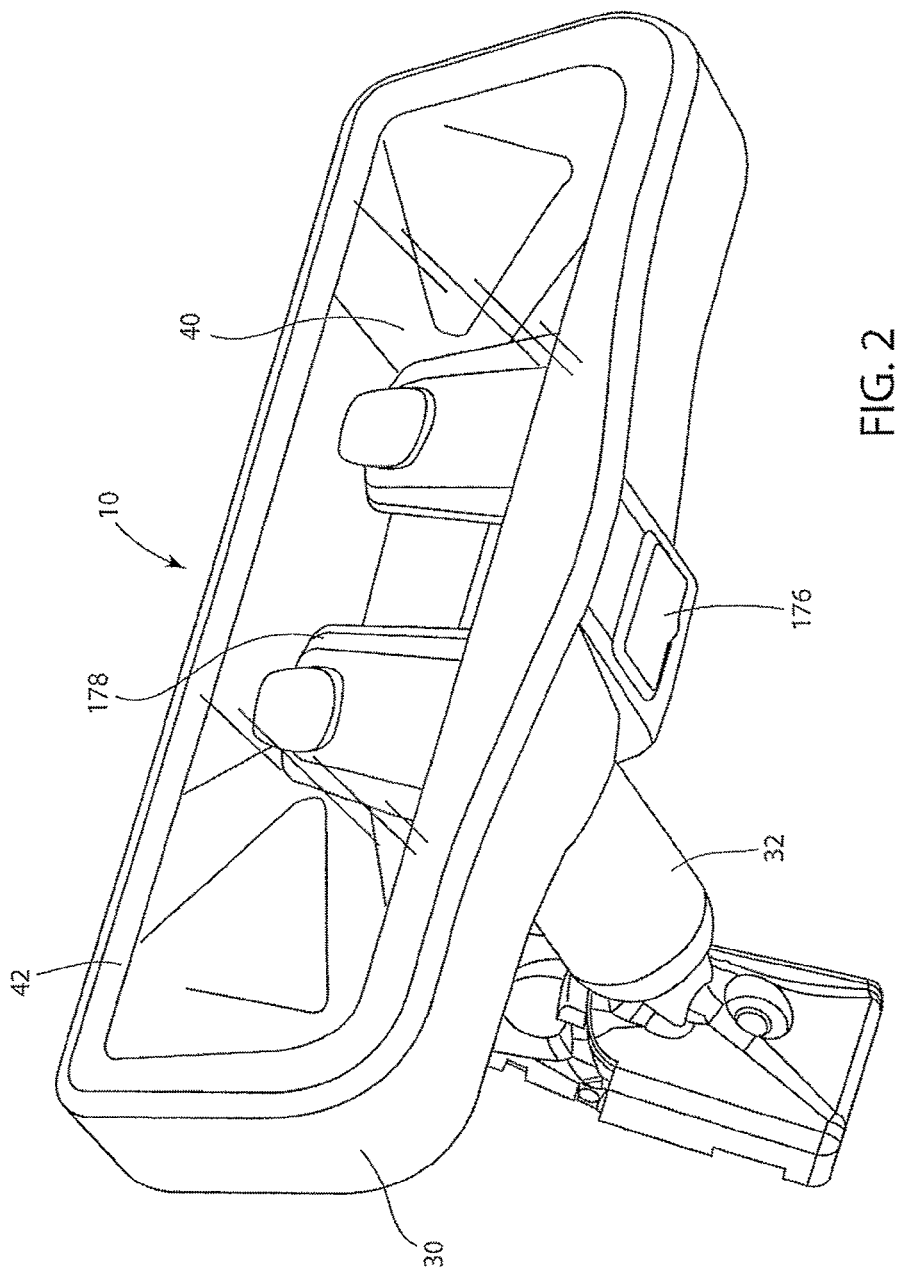
FIG. 2 is a bottom front perspective view of the display mirror assembly of FIG. 1.
Figure 3:
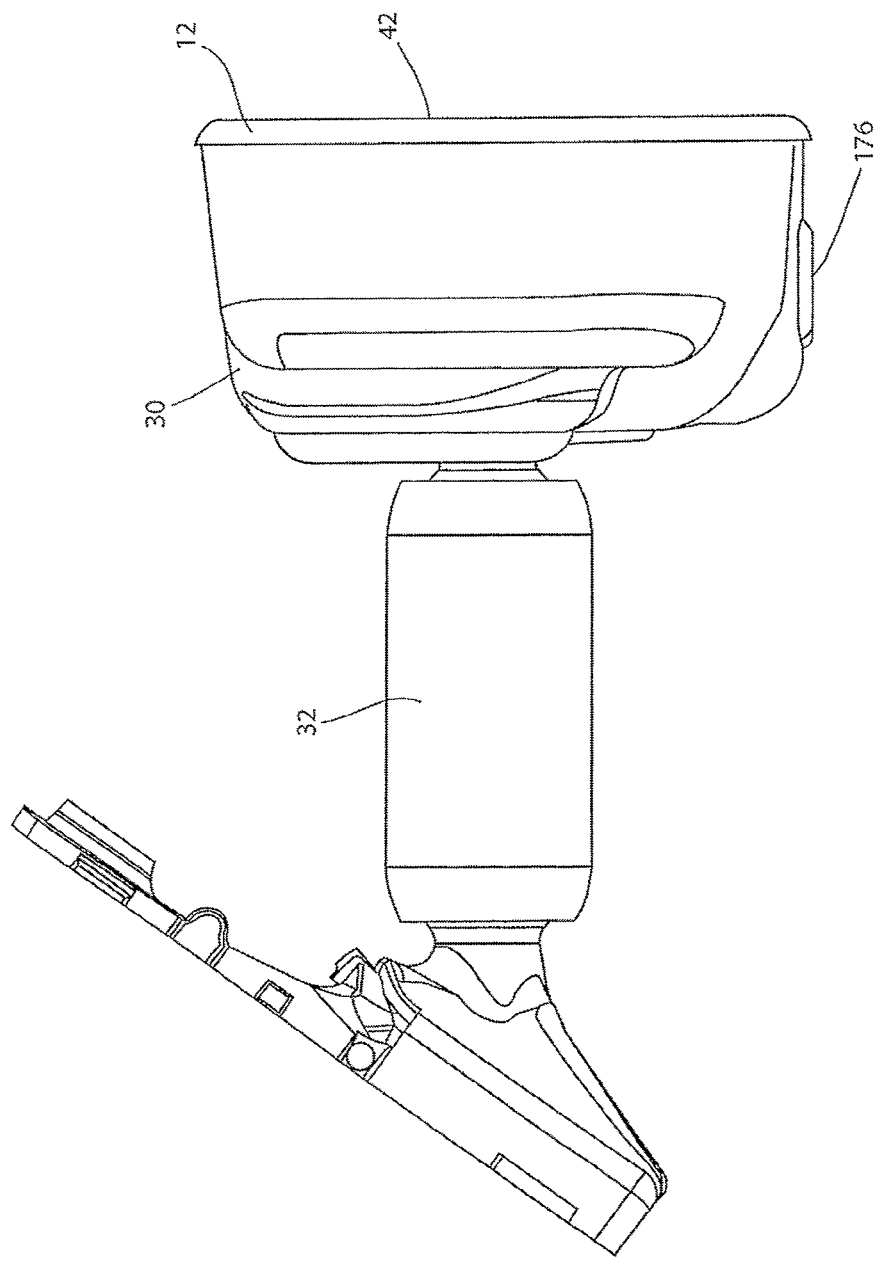
FIG. 3 is a side elevation view of the display mirror assembly of FIG. 1.
Figure 4:
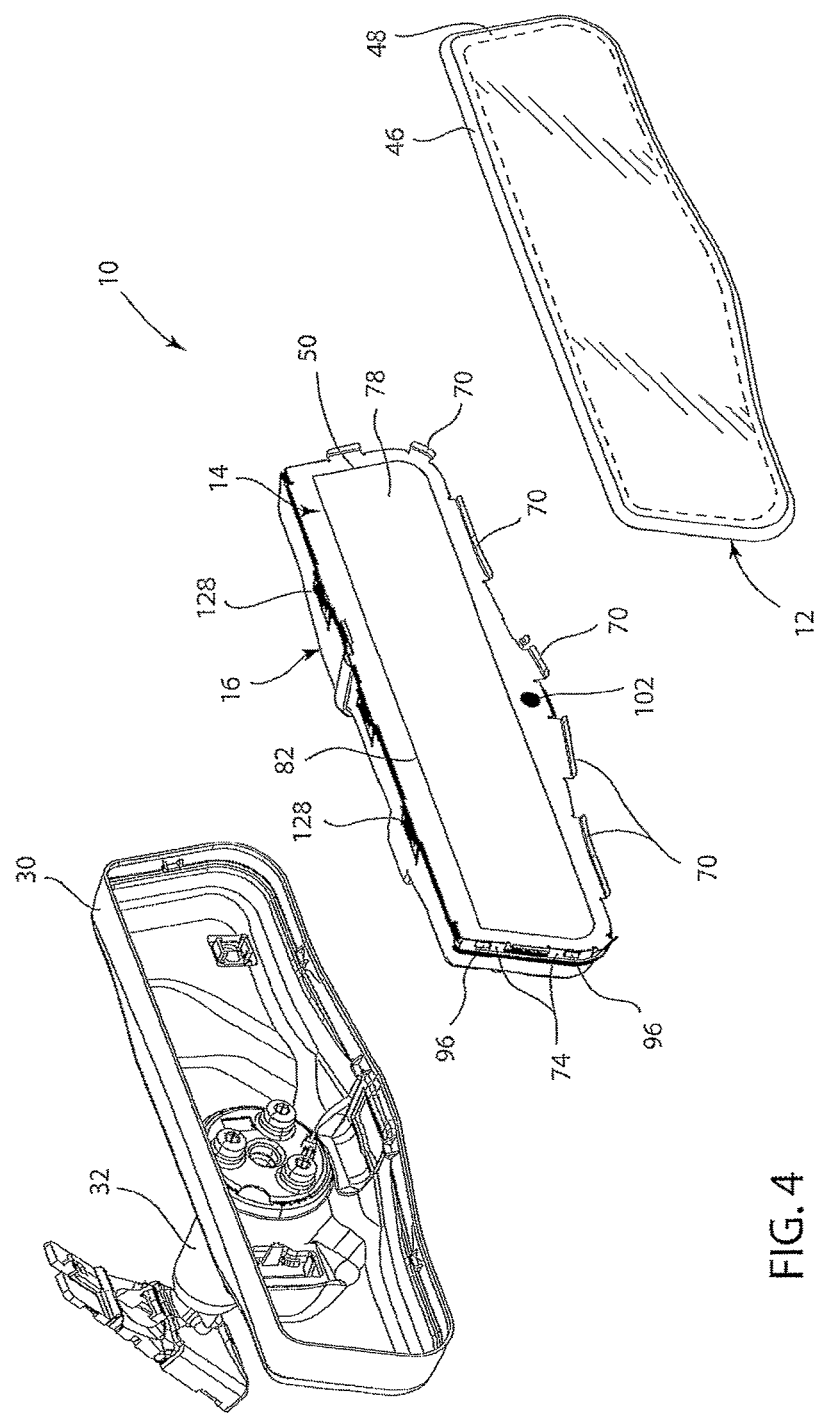
FIG. 4 is a partially exploded top perspective view of the display mirror assembly of FIG. 1.
Figure 5:
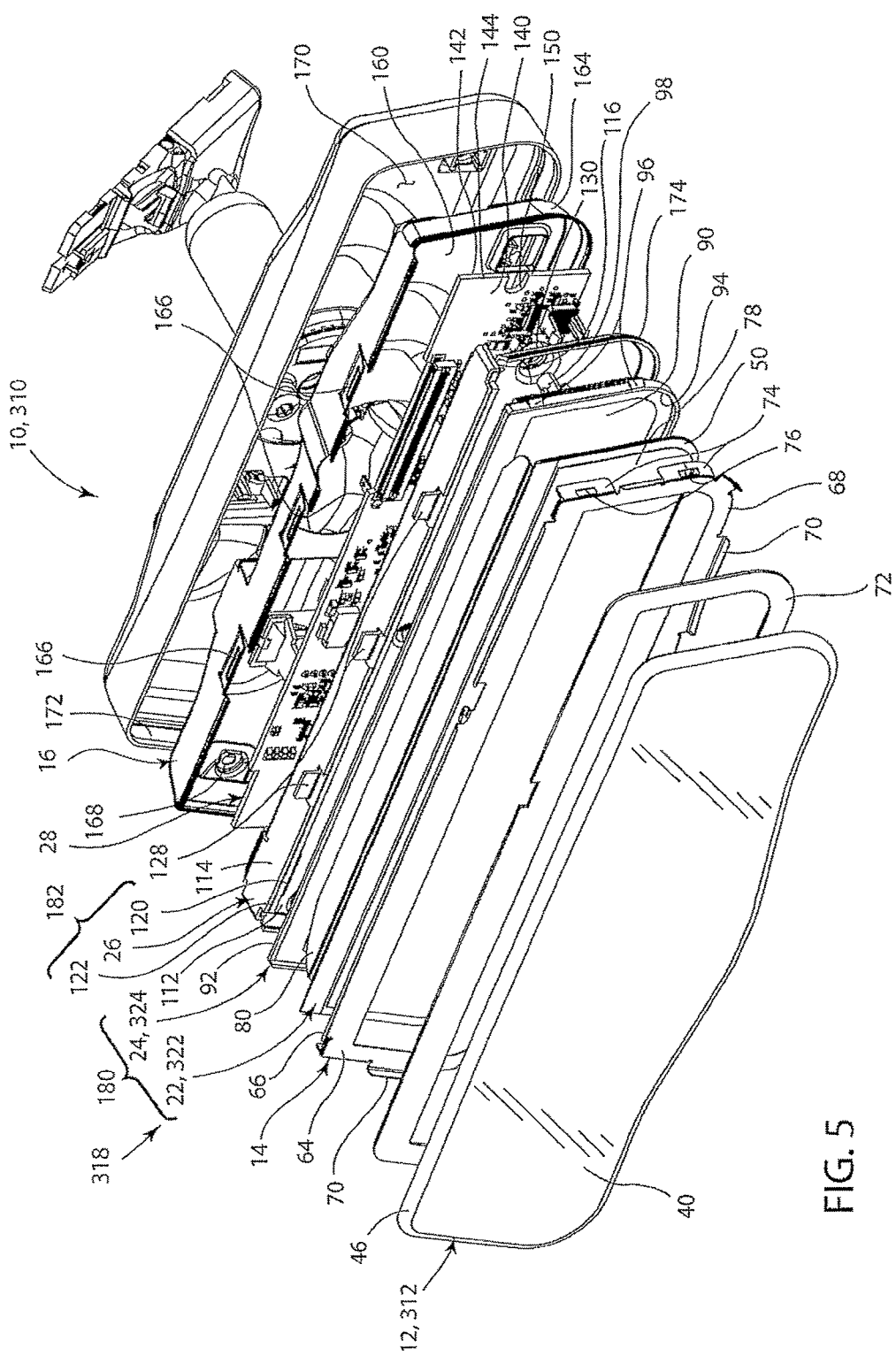
FIG. 5 is a partially exploded top perspective view of the display mirror assembly of FIG. 1.
Figure 6:
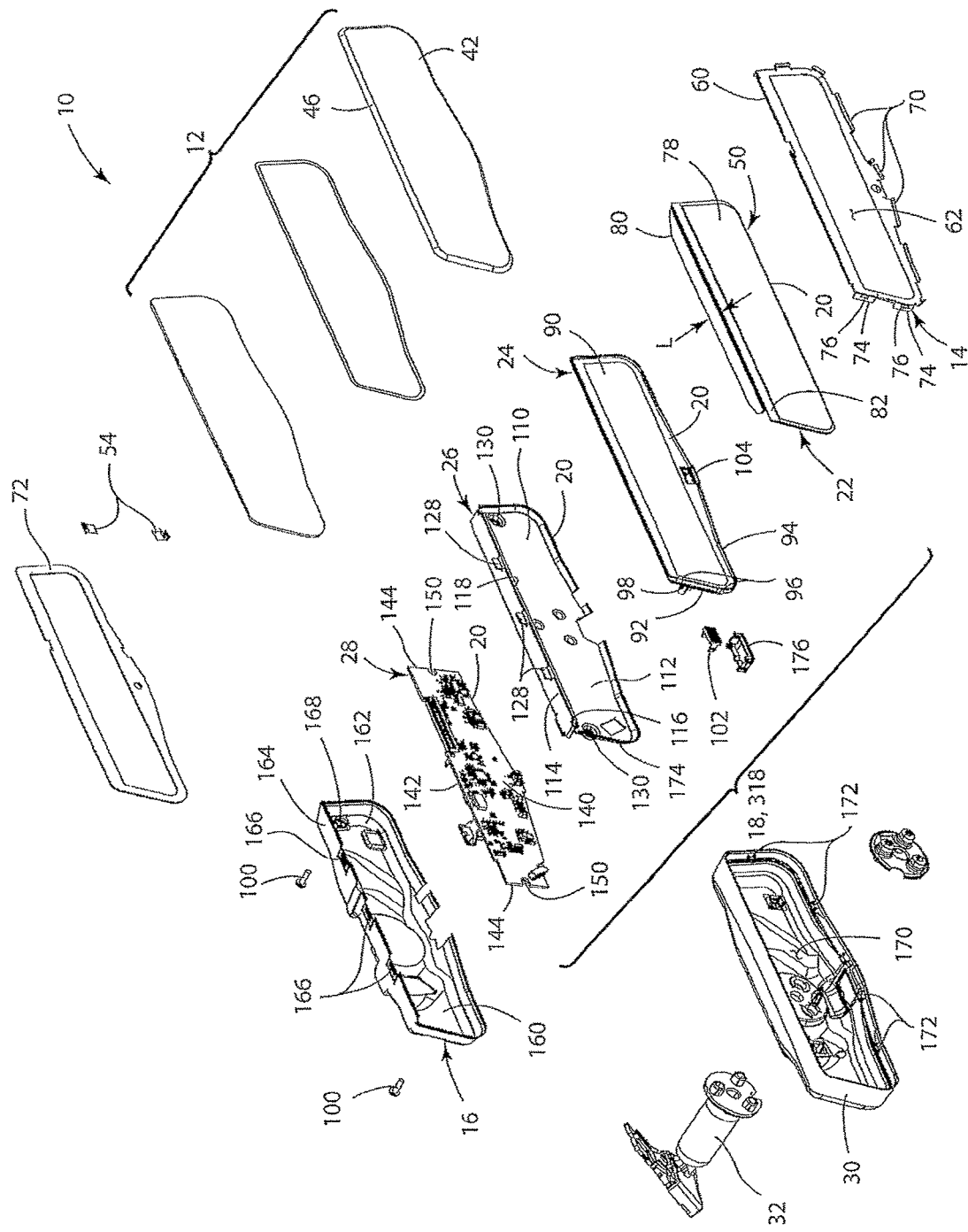
FIG. 6 is an exploded top perspective view of the display mirror assembly of FIG. 1.

Referring now to FIGS. 1-3, reference numeral 10 generally designates a display mirror assembly for a vehicle. The display mirror assembly 10 includes a partially reflective, partially transmissive element 12 (also referred to as a "glass element" herein) and a display module 18 (FIG. 6) that is viewed through the partially reflective, partially transmissive element 12. As shown in FIG. 4, the display mirror assembly 10 further includes a front shield 14 and a rear shield 16 which shield and support the partially reflective, partially transmissive element 12 and the display module 18 (FIG. 6). As shown in FIGS. 5-6, the display module 18 generally includes several components 20, including a display 22, an optic block 24, a heat sink 26, and a primary PCB 28. A housing 30 at least partially receives the front shield 14, the display module 18, and the rear shield 16, and includes a mounting member 32 extending rearwardly therefrom. The mounting member 32 is adapted for mounting on a windshield of a vehicle.

Referring generally to FIGS. 1-3, the display mirror assembly 10 has a viewing area 40, which includes a front surface 42 of the glass element 12. The viewing area 40 may be a rectangular shape, a trapezoidal shape, or any custom contoured shape desired for aesthetic reasons.

Referring to FIG. 4, the display mirror assembly 10 for a vehicle is shown, with the components partially exploded. The display mirror assembly 10 includes the glass element 12, the front shield 14 and the rear shield 16 encapsulating the display module 18, the rear housing 30, and the mounting member 32. As shown in FIGS. 4-6, the front shield 14, the rear shield 16, and components of the display module 18 include various retaining features to operably connect the several components of the display module 18 with the front shield 14, the rear shield 16 and each other, and to provide support to the display module 18. Specifically, the front shield 14 includes retaining features to operably connect the front shield 14 to the display module 18, and the rear shield 16 has retaining features to operably connect the rear shield 16 to the display module 18. The retaining features generally include snap fit connections, tab and slot connections, screw connections, and other known retaining features. Some or all of the retaining features may also be strengthened by the addition of adhesive compounds. Certain non-limiting illustrative examples of retaining features are described in detail herein.

The display mirror assembly 10 will hereafter be described in greater detail, beginning with the elements closest to the intended viewer, and extending rearwardly away from the viewer.

As shown in FIG. 4, the glass element 12 is generally planar, with an outer perimeter 46 and a border 48 around the outer perimeter 46. The border 48 may incorporate a chrome ring or other similar finish to conceal the front shield 14 and other elements located behind the glass element 12 in the display mirror assembly 10, including without limitation a seal on an electrochromic unit, an applique, foam adhesive, or pad printing. The border 48 may extend from the outer perimeter 46 of the glass element 12 to an outer edge 50 of the display 22. Alternatively, the border 48 may be narrower and not reach from the outer perimeter 46 to the outer edge 50 of the display 22 along at least some portions of the border 48. The perimeter of the glass element 12 may also have a ground edge, a beveled edge, or be frameless.

The glass element 12 may be an electro-optic element or an element such as a prism. One non-limiting example of an electro-optic element is an electrochromic medium, which includes at least one solvent, at least one anodic material, and at least one cathodic material. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity change from a first phase to a second phase. The electrochromic component may be a single-layer, single-phase component, multi-layer component, or multi-phase component, as described in U.S. Pat. No. 5,928,572 entitled "Electrochromic Layer And Devices Comprising Same," U.S. Pat. No. 5,998,617 entitled "Electrochromic Compounds," U.S. Pat. No. 6,020,987 entitled "Electrochromic Medium Capable Of Producing A Pre-selected Color," U.S. Pat. No. 6,037,471 entitled "Electrochromic Compounds," U.S. Pat. No. 6,141,137 entitled "Electrochromic Media For Producing A Pre-selected Color," U.S. Pat. No. 6,241,916 entitled "Electrochromic System," U.S. Pat. No. 6,193,912 entitled "Near Infrared-Absorbing Electrochromic Compounds And Devices Comprising Same," U.S. Pat. No. 6,249,369 entitled "Coupled Electrochromic Compounds With Photostable Dication Oxidation States," and U.S. Pat. No. 6,137,620 entitled "Electrochromic Media With Concentration Enhanced Stability, Process For The Preparation Thereof and Use In Electrochromic Devices"; U.S. Pat. No. 6,519,072, entitled "Electrochromic Device"; and International Patent Application Serial Nos. PCT/US98/05570 entitled "Electrochromic Polymeric Solid Films, Manufacturing Electrochromic Devices Using Such Solid Films, And Processes For Making Such Solid Films And Devices," PCT/EP98/03862 entitled "Electrochromic Polymer System," and PCT/US98/05570 entitled "Electrochromic Polymeric Solid Films, Manufacturing Electrochromic Devices Using Such Solid Films, And Processes For Making Such Solid Films And Devices," which are herein incorporated by reference in their entirety. The glass element 12 may also be any other element having partially reflective, partially transmissive properties. To provide electric current to the glass element 12, electrical elements are provided on opposing sides of the element, to generate an electrical potential therebetween. A J-clip 54 is electrically engaged with each electrical element, and element wires extend from the J-clips 54 to the primary PCB 28.

Now referring to FIGS. 5-6, the front shield 14 functions to shield the display module 18 from radio frequency (RF) electromagnetic radiation and to provide support for the glass element 12 and the display module 18. The front shield 14 is formed from one or more materials which are suitable to block RF radiation, including without limitation steel. As a non-limiting example, the front shield 14 can be formed from a stamped steel material which is about 0.2 mm thick.

Also as shown in FIGS. 5-6, the front shield 14 is generally shaped in the form of a ring 60 having an opening 62 therethrough. The front shield 14 has a front side 64, rear side 66, and an outer surface 68 which is generally coextensive with the outer perimeter 46 of the glass element 12. The front shield 14 includes retaining features 70 extending forwardly therefrom, to mechanically engage the glass element 12. An adhesive, such as a foam adhesive 72, may also be used to secure the glass element 12 to the front shield 14. The front shield 14 further includes rearwardly directed tabs 74 to operably engage the rear shield 16 (or a component of the display module 18). The rearwardly directed tabs 74 further include holes 76 therethrough, to operably engage at least one component of the display module 18, such as the optic block 24.

As best shown in FIG. 6, the display module 18 is disposed behind the front shield 14, with the display 22 viewable through the opening 62 in the front shield 14. The components of the display module 18 are ordered, from the front shield 14 toward the rear shield 16, the display 22, the optic block 24, the heat sink 26, and the primary PCB 28.

The display 22 is generally planar, with the outer edge 50 defining a front surface 78. The front surface 78 of the display 22 can be shaped to correspond to and fit within the shape of the viewing area 40 of the display mirror assembly 10. Alternatively, the display 22 may have a front surface 78 which fits within, but is not complementary to the viewing area 40, for example, where the front surface 78 of the display 22 is generally rectangular and the front surface 42 of the glass element 12 has a contoured outer perimeter 46. The distance between the outer edge 50 of the display 22 and the outer perimeter 46 of the glass element 12 is about 9 mm or less along at least a portion of the outer edge 50. In one embodiment, the display 22 has a viewable front surface 78 area which is about 56% to about 70% of the viewing area 40 of the glass element 12.

The display 22 may be LCD, LED, OLED, plasma, DLP or other display technology. The display 22 further includes a flexible electrical connector 80 which is operably mechanically and electrically connected with the primary PCB 28. The flexible electrical connector 80 has a length L which is sufficient to wrap around the display module 18 components between the display 22 and the primary PCB 28, and has a width which extends substantially along a top edge 82 of the display 22. The flexible electrical connector 80, when operatively connected to the primary PCB 28, aids in securing the components along a top edge of the display module 18.

As shown in FIGS. 5-6, the optic block 24 includes a front side 90 which is facing the display 22, a rear side 92 which is facing the heat sink 26, and an outer perimeter 94. The optic block 24 further includes tabs 96 extending generally outwardly therefrom around at least a portion of the outer perimeter 94. The tabs 96 are received through the holes 76 in the rearwardly directed tabs 74 of the front shield 14, to operably mechanically engage the optic block 24 with the front shield 14. The optic block 24 further includes at least one screw-receiving element 98 on the rear side 92 thereof. The screw-receiving element 98 is adapted to engage a screw 100 threaded through the rear shield 16 and the display module 18 components between the optic block 24 and the rear shield 16. In alternate embodiments, the tabs 96 for engaging the front shield 14, the screw-receiving elements 98, or both, could be provided on different components of the display module 18.

As shown in FIGS. 4 and 6, a glare sensor 102 is provided on the front side 90 of the optic block 24, in a location which receives light through the glass element 12, and which is not behind the display 22. The glare sensor 102 is snap-fit into a receiving aperture 104 in the optic block 24. The glare sensor 102 receives light from headlamps of a trailing vehicle, and measures information regarding the likely glare visible on the glass element 12 and communicates this information to the display mirror assembly 10 so that the display mirror assembly 10 can be optimized to allow viewing of the display 22 through the glass element 12. The glare sensor's 102 optical vertical/horizontal pattern is symmetrical, so that orientation of the glare sensor 102 is not significant. The glare sensor 102 could also be packaged at least partially within the housing 30 of the display mirror assembly 10 and have a light guide which is configured to propagate light to the glare sensor 102. The glare sensor 102 could also be an imager on a rear portion of the vehicle, wherein a signal representative of the received light is communicated from the glare sensor 102 to the display mirror assembly 10.

As shown in FIGS. 5-6, the heat sink 26 is disposed rearwardly from the optic block 24, and dissipates heat generated by the primary PCB 28 and other components of the display module 18. The heat sink 26 has a generally planar body 110 with a front side 112 and a top edge 114. A channel 116 extends along the top edge 114 of the heat sink 26, and defines a forward-facing opening 118. An edge lit PCB 120 and a gap filler 122 are disposed partially within the channel 116, with the edge lit PCB 120 extending generally perpendicularly from the heat sink 26 in a forward direction, and having an operable side which is facing downward, away from the top edge 114. The edge lit PCB 120 includes a wiring adapted for electrical connection with the primary PCB 28, to permit electrical power and signals to be supplied to the edge lit PCB 120. A plurality of tabs 128 extend upwardly from the top edge 114 of the heat sink 26, for mechanical engagement with the rear shield 16.

The heat sink 26 also includes at least one hole 130 therethrough to receive a screw 100 threaded from the rear shield 16 to the optic block 24. The screw-receiving element 98 of the optic block 24 is optionally raised, to extend through the hole 130 in the heat sink 26 and receive the screw 100. The screw-receiving element 98 of the optic block 24 may also aid in alignment of display module 18 components during manufacturing and will provide additional reinforcement to the display module 18 in the interaction between components if it is raised.

The primary PCB 28 operates to provide electrical power and control for the components of the display module 18 and for the glass element 12. As shown in FIGS. 5-6, the primary PCB 28 is generally planar, with a front side 140, a rear side 142, and side edges 144. The front side 140 is facing the heat sink 26 and the rear side 142 is facing the rear shield 16. Electrical components are generally oriented on the rear side 142 of the primary PCB 28. The primary PCB 28 includes an electrical connector for operable electrical engagement with the electrical element wires of the glass element 12, an electrical connector for operable electrical engagement with the flexible electrical connector 80, and an electrical connector for operable electrical engagement with the wiring harness. Additional functional elements that may be provided on the display mirror assembly 10 may also be electrically connected to the primary PCB 28, such as the glare sensor 102 and any other functional buttons or features of the display mirror assembly 10. The primary PCB 28 further includes side cutouts 150 along the side edges 144, to permit passage of the screws 100 used to secure the rear shield 16 to the components of the display module 18.

The rear shield 16 functions to shield the display module 18 from RF radiation. As best shown in FIGS. 4-5, the rear shield 16 also serves to encapsulate the display module 18, and further interlock the components of the display mirror assembly 10. The rear shield 16 is formed from a material which is suitable to block such radiation and provide the desired support for the display mirror assembly 10, such as steel. As a non-limiting example, the rear shield 16 can be formed from stamped steel with a thickness of about 0.381 mm.

As shown in FIG. 6, the rear shield 16 includes a rear wall 160 having an outer perimeter 162, and a peripheral wall 164 extending forwardly from the rear wall 160 about at least a portion of the outer perimeter 162. The peripheral wall 164 has slots 166 therein, which correspond to the upstanding tabs 128 along the top edge 114 of the heat sink 26 and are operably mechanically engageable therewith. The rear shield 16 further includes at least one hole 168 therethrough to accommodate the screw 100, where the screw 100 extends through the rear shield 16 and into the components of the display module 18 to secure the rear shield 16 to the display module 18. The screw 100 extends through the rear wall 160 of the rear shield 16, through the side cutouts 150 of the primary PCB 28, through the heat sink 26, and is secured to the screw-receiving element 98 on the rear side 92 of the optic block 24.

The rear housing 30 includes a forwardly directed cavity 170, into which all or a portion of the front shield 14, rear shield 16, and the display module 18 supported therebetween are inserted. The rear housing 30 includes mechanically engaging features 172 which snap fit with corresponding engagement features 174 located on the peripheral wall 164 of the rear housing 30 or on a display module 18 component such as the heat sink 26. The mounting member 32 is operably engaged with the rear housing 30 in any known manner.

With respect to the following description, the display mirror assembly 10 is considered "on axis" when a line perpendicular to the plane of the glass element 12 extends toward the eyes of a viewer. Due to the display 22 being viewed through the glass element 12, any glare on the glass element 12 may interfere with the visibility of the display 22. When the display mirror assembly 10 is on axis and is being used during night time driving conditions, headlights from a trailing vehicle (i.e., a vehicle driving behind the vehicle with the display mirror assembly 10) can cause a glare which is visible to the driver. According to one embodiment of the present invention, an actuator device 176, as shown in FIGS. 2 and 6, is operably coupled to the display mirror assembly 10. When actuated, the actuator device 176 may toggle the glass element 12 and corresponding support assembly between the "on-axis" position and the "off-axis" position (i.e., away from a direct line toward the driver's eyes). In this way, the actuation of the actuator device 176 tilts the glass element 12 upwards, to move the mirror assembly 10 to an off-axis position. However, it should be appreciated that the actuator device 176 can be configured to move the mirror assembly 10 in any direction with respect to the axis. Additionally, in an exemplary embodiment, the actuator device 176 can also be configured to turn the display 22 on or off. In this configuration, when the actuator device 176 is actuated to move the mirror assembly 10 off-axis, the display 22 can be turned on. When the actuator device 176 is actuated to move the mirror assembly 10 on-axis, the display 22 can be turned off.

Figure 7:
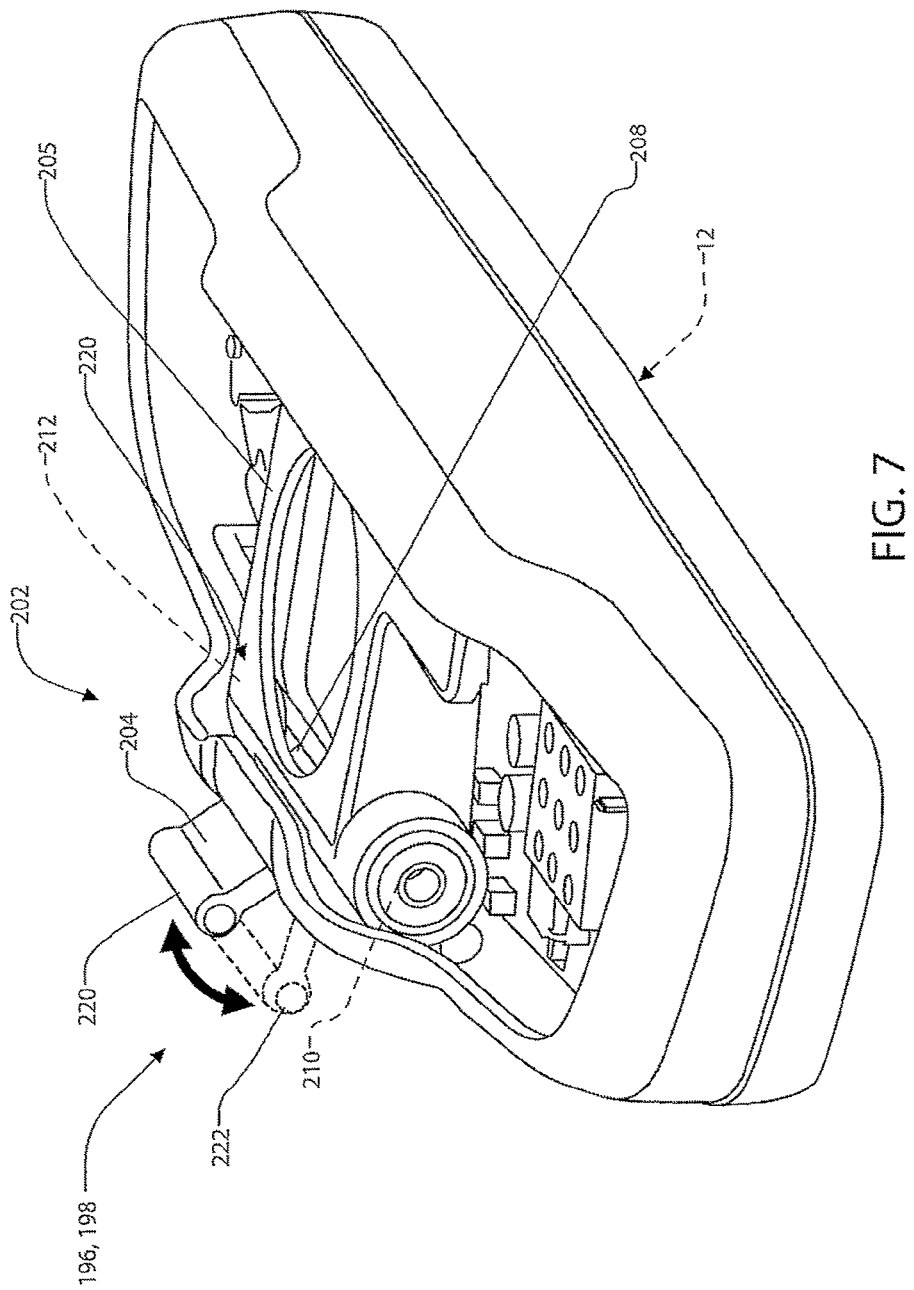
FIG. 7 is a perspective view of an adjusting assembly that may be incorporated with the display mirror.

Referring now to FIG. 7, the actuator device 176 may be configured to form a smooth adjusting assembly by incorporating a soft adjust mechanism 198. In an exemplary implementation, the smooth adjusting assembly may be implemented as a toggle mechanism 202. The toggle mechanism 202 may be utilized in the assembly 10 to perform similar functions to the actuator device as discussed herein, and as such, like reference numerals are utilized to discuss like components for clarity. The soft adjust mechanism 198 may be configured to prevent a jarring or snapping motion attributed to toggling an actuator device between a first position to a second position to adjust an axial alignment of the assembly 10 as discussed herein.

The toggle mechanism 202 may be configured to move or adjust the angular position of the glass element 12. The toggle mechanism 202 may comprise a lever 204 configured to pivotally engage a housing 205 of a positioning assembly 206 via an axial engagement portion 208. As discussed herein, the toggle mechanism 202 may form a portion of the positioning assembly 206, which may be configured to adjust an angular position of the glass element 12. Further, the positioning assembly 206 may correspond to the soft adjust mechanism 198. The axial engagement portion 208 may comprise a first engagement end portion 210 and a second engagement end portion 212. In this configuration, the toggle mechanism 202 may be manually actuated by a passenger or operator of a vehicle to toggle the mirror assembly 10 between the on-axis or off-axis position relative to a reflected line of sight directed toward the eyes of the operator.

Figure 8:
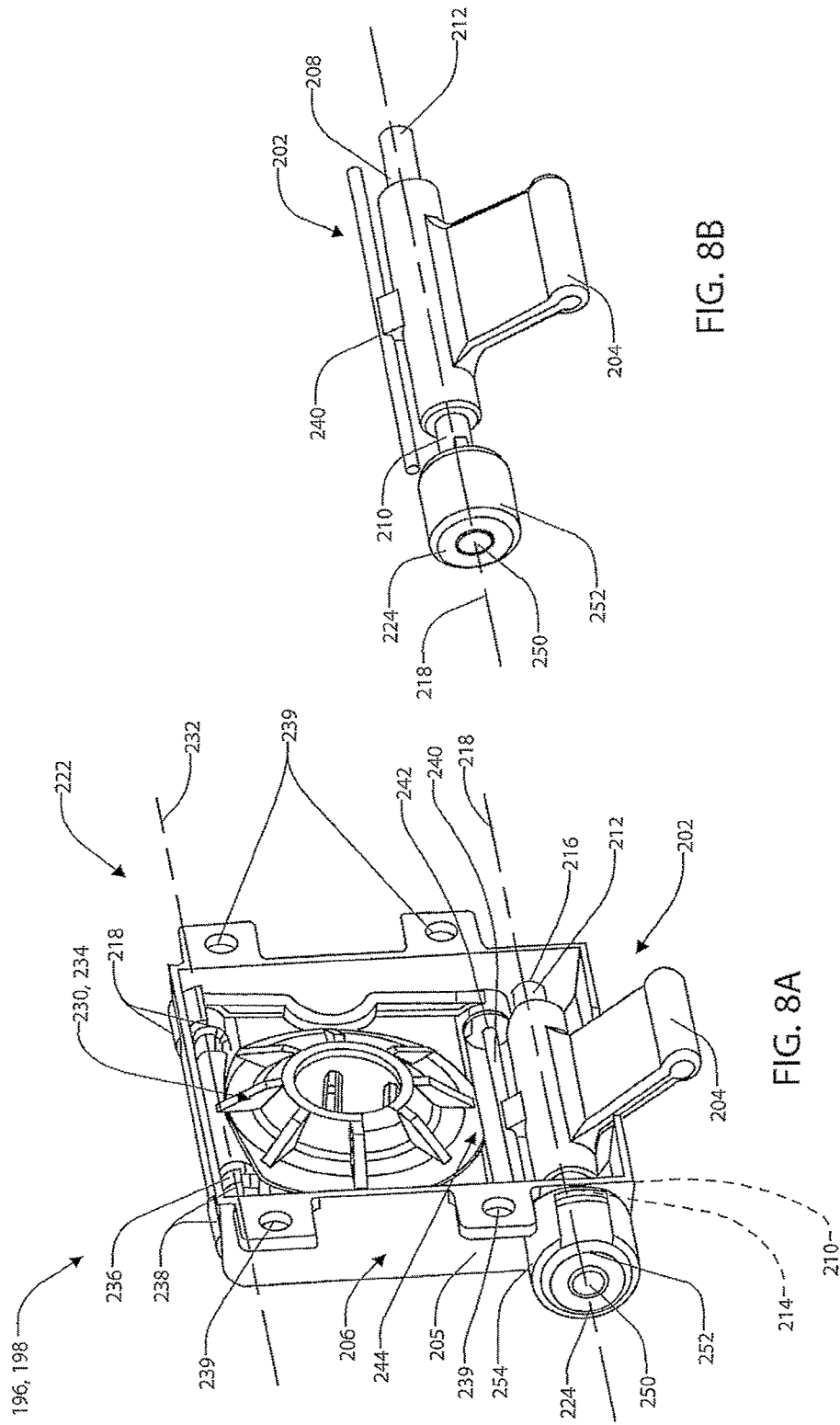
FIG. 8A is a perspective view of a positioning assembly for the display mirror.
FIG. 8B is a perspective view of a toggle mechanism of the positioning assembly.
Figure 9:
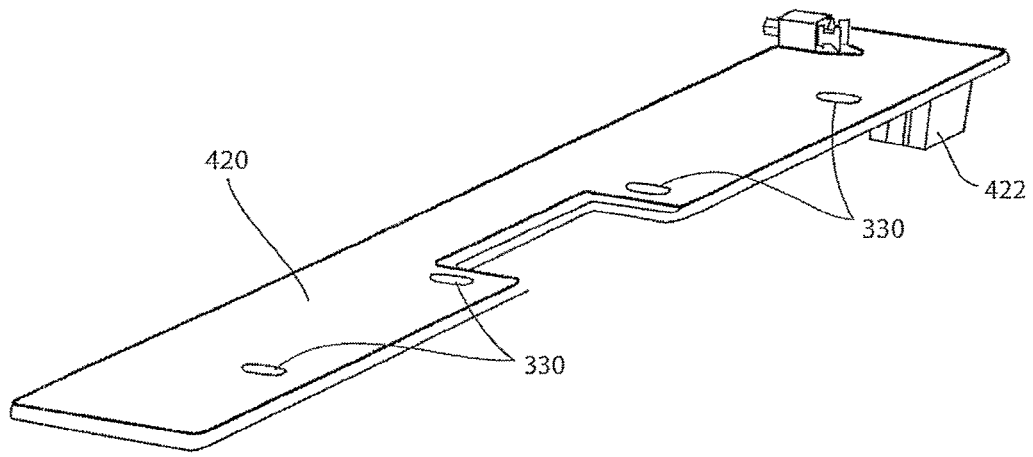
FIG. 9 is a projected view of an edge-lit printed circuit board (PCB)
Figure 10:
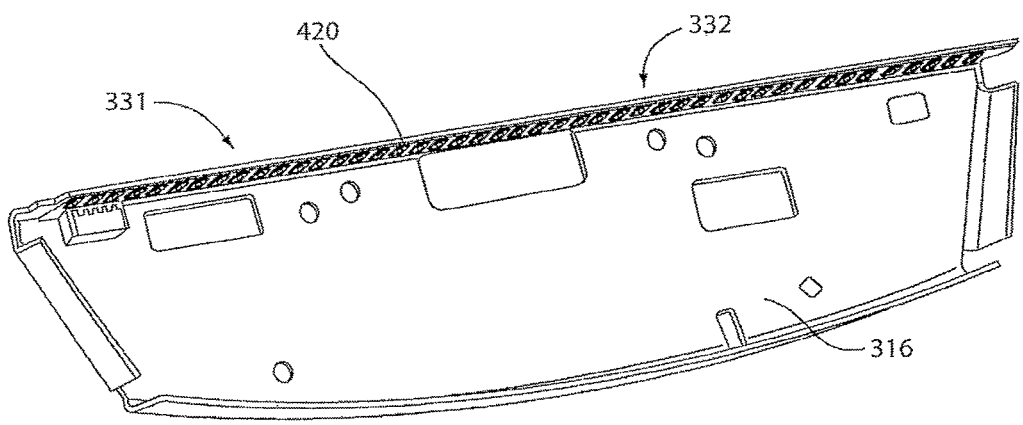
FIG. 10 is a projected view of a rear shield connected to an edge-lit PCB.
Figure 11:
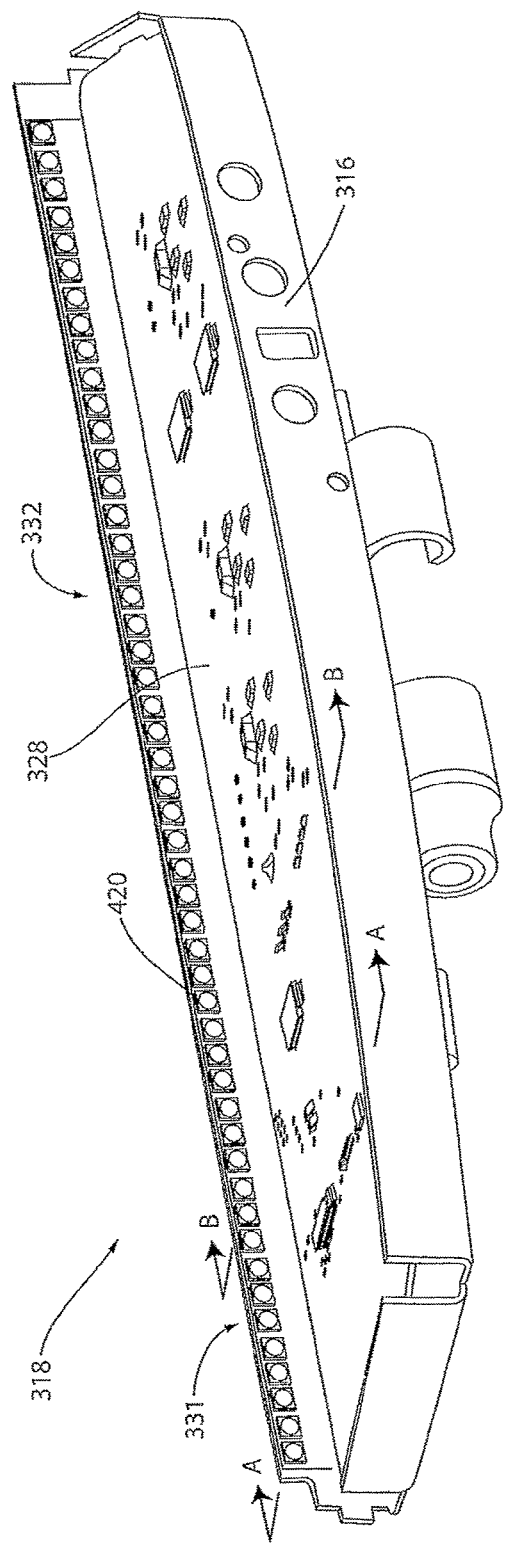
FIG. 11 is a projected view of a rear shield connected to an edge-lit PCB and a primary PCB.

Referring now to FIGS. 7, 8A, and 8B, the positioning assembly 206 may comprise a positioning housing 205 forming a first engaging aperture 214 and a second engaging aperture 216 configured to receive the first engagement end portion 210 and the second engagement end portion 212, respectively. The toggle mechanism 202 may be rotated about a first pivotal axis 218 from a first position 220 to a second position 222 as demonstrated by the arrow in FIG. 7. The first position 220 may correspond to an on-axis position wherein the glass element 12 is on-axis to direct the reflected line of sight to the operator of the vehicle. Additionally, in the first position 220, the positioning assembly 206 may further be configured to control the display 22 to an off-state.

The second position 222 may be configured to orient the toggle mechanism 202 in the off-axis position. Additionally, in the second position 222, the positioning assembly 206 may further be configured to control the display 22 to an on-state. As discussed herein, changing from the second position 222 to the first position 220 may be manually actuated by a passenger of the vehicle to simultaneously adjust the glass element 12 to an on-axis position and control the display 22 to an off-state. This novel functionality may provide for simple and accurate operation of the positioning assembly 206. In this configuration, the display 22 may be selectively activated and deactivated in the second position 222 (e.g. off-axis) and the first position 220 (e.g. on-axis), respectively, such that light reflected from the glass element 14 does not interfere with the light emitted from the display 22.

Changing from the first position 220 to the second position 222 may also be manually actuated to simultaneously adjust the glass element 12 to an off-axis position and activate the display 22. In off-axis configuration, the reflected field of view of the glass element 12 is directed toward a headliner of the vehicle and away from the eyes of the operator. In this way, the image data on the display 22 may be visible to an operator without viewing light reflected from the assembly 10. As further discussed in reference to FIGS. 8A and 8B, the positioning assembly 206 may comprise a damper 224 configured to control the rotational movement about the first pivotal axis 218 of the axial engagement portion 208 of the toggle mechanism 202 from a first position 220 to a second position 222 and vice versa.

Referring now to FIGS. 8A and 8B, the positioning assembly 206 and toggle mechanism 202 are shown, respectively. The positioning assembly 206 may form an intermediate connection between the mounting member 32 and the rear housing 30 of the mirror assembly 10. For example, the mounting member 32 may be configured to connect to a receiving member 230 of the positioning assembly 206. Additionally, the housing 205 may be in pivotal connection with the receiving member 230 via a second pivotal axis 232. The second pivotal axis 232 may be formed by a second pivoting assembly 234 formed by a fulcrum pin 236 of the receiving member 230 and a plurality of rotational brackets 238 of the housing 205. In this configuration, the housing 205 may rotate about the fulcrum pin 236 in response to the toggle mechanism 202 being adjusted from the first position 220 to the second position 222.

As previously discussed, the toggle mechanism 202 may be configured to pivotally engage the housing 205 via the first engagement end portion 210 and the second engagement end portion 212. The first engagement end portion 210 and the second engagement end portion 212 may be configured to connect with the first engaging aperture 214 and the second engaging aperture 216 to define the first pivotal axis 218. The toggle mechanism 202 may further form a lateral displacement arm 240 configured to engage a lever aperture 242 formed in a distal end portion 244 of the receiving member 230. In this way, the housing 205 may be moved relative the mounting member 32.

The housing 205 may further be connected to the rear housing 30 via a plurality of fastener apertures 239. A plurality of fasteners may interconnect fastening tabs of the housing 205 forming the fastener apertures 239 to the rear housing of the mirror assembly 10. In this configuration, the receiving member 230 forms a lever configured to adjust the angular orientation of the rear housing 30 and the mirror assembly 10. In this way the glass element 12 may be shifted from the on-axis position to the off-axis position as discussed herein.

In operation, the lever 204 of the toggle mechanism 202 may be rotated about the first pivotal axis 218 to adjust the position of the lateral displacement arm 240. The motion of the lateral displacement arm 240 may cause the distal end portion 244 of the receiving member 230 to similarly move due to the engagement of the lateral displacement arm 240 and the lever aperture 242. The motion of the receiving member 230 may further result in a change in an angle of the receiving member 230 relative to the housing 205. The change in the angle between the receiving member 230 and the housing 205 may result in the rear housing 30 and consequently, the mirror assembly 10 being adjusted from the first position 220 to the second position 222.

The movement from the first position 220 to the second position 222 is controlled by the damper 224. The damper 224 may correspond to a rotational damper comprising a rotating portion 250 in connection with the first engagement end portion 210 and a fixed portion 252 in connection with the housing 205 via an engaging sleeve 254 formed by or in connection with the housing 205. The rotational movement of the rotating portion 250 relative the fixed portion 252 is controlled or dampened such that the lever 204 of the toggle mechanism 202 moves smoothly from the first position 220 to the second position 222.

The damper 224 may correspond to various forms of rotational dampers. For example, the damper 224 may correspond to a viscous damper having rigid plastic structure. In some embodiments, the damper 224 may correspond to a rotary or rotational damper configured to limit a rate of change of rotational motion of the toggle mechanism 202 about the first pivotal axis 218. In some embodiments, the damper 224 may similarly be implemented as a lateral damping mechanism configured to limit the lateral movement of the lateral displacement arm 240, which may be anchored to the housing 205. As discussed herein, the damper 220 may provide for controlled movement of the positioning assembly 206 relative the receiving member 230 to control the movement of the mirror assembly 10.

Though discussed in detail in reference to the mirror assembly 10, the positioning assembly 206 incorporating the damper 224 may be utilized in a variety of display mirrors and/or prism mirrors. For example, the mirror assembly may be utilized in a conventional prism mirror of a vehicle comprising a positioning assembly configured to adjust an angular orientation of a glass element or mirror assembly. Such a mirror may correspond to a two-position prism mirror such as that discussed in U.S. Pat. No. 3,740,122A, which is incorporated herein by reference in its entirety.

Additionally, to provide information to the viewer of the display mirror assembly 10, the display mirror assembly 10 may include information regarding the field of view 178, such as a partially transmissive graphic overlay or an image on the display 22 visible on the viewing area 40 when the display mirror assembly 10 is in use.

In order to construct the display mirror assembly 10 described herein, the J-clips 54 are installed on the glass element 12, and then element wires are soldered to the top portion of the J-clips 54. The glass element 12 is then secured to the front side 64 of the front shield 14, using the foam adhesive 72 and the forward retaining features 70 of the front shield 14. The front shield 14 is then inverted, with the glass element 12 facing downwardly on a protective surface.

A first subassembly 180 (FIG. 5), including the display 22 and optic block 24, is assembled by snap-fitting the glare sensor 102 into the receiving aperture 104 in the optic block 24, and adhering the display 22 to the optic block 24. The adhesion of the display 22 and optic block 24 may include coating the front side 90 of the optic block 24 with an adhesive and applying a release liner over the adhesive, wherein the release liner is easily removable from the adhesive. When it is time to assemble the display 22 and optic block 24, the release liner is removed, and the display 22 is positioned on the front side 112 of the optic block 24. To position the display 22, one edge of the display 22 is aligned in the appropriate location on the optic block 24, and then the display 22 is rotated into contact with the front side 90 of the optic block 24. The first subassembly 180 is placed in position on the rear side 66 of the front shield 14. The tabs 96 extending outwardly from the optic block 24 are inserted through the holes 76 in the rearwardly directed tabs 74 of the front shield 14.

A second subassembly 182 (FIG. 5), including the heat sink 26 and edge lit PCB 120, is assembled. To assemble the second subassembly 182, the gap filler 122 is adhered to the edge lit PCB 120. The adhesion may include coating one side of the gap filler 122 with adhesive and then applying the gap filler 122 to the edge lit PCB 120 so that it does not interfere with the operable side of the edge lit PCB 120. The gap filler 122 and edge lit PCB 120 are then inserted into the opening in the channel 116 on the front side 112 of the heat sink 26. Locating features are optionally provided on the heat sink 26, the edge lit PCB 120 or both, to aid in inserting the side lit PCB and gap filler 122 into the channel 116. The second subassembly 182 is placed in position on the rear side 92 of the optic block 24. The screw-receiving elements 98 extending rearwardly from the optic block 24 extend through the holes 130 in the heat sink 26.

The primary PCB 28 is placed above the top edge of the second subassembly 182, with the front side 140 facing upwards. The flexible electrical connector 80 from the display 22 is mated with the electrical connector therefor. The primary PCB 28 is then rotated 180 degrees about the top edge of the second subassembly 182, so that the front side 140 is in contact with the heat sink 26. When rotating the primary PCB 28, the flexible electric connector is wrapped over the top edge of at least a portion of the display module 18. The element wires are electrically connected with the electrical connectors therefor, and the wiring harness for the edge lit PCB 120 is connected with the electrical connector therefor.

As shown in FIGS. 4-5, the rear shield 16 is placed over the primary PCB 28, and the tabs 128 extending upwardly from the heat sink 26 are engaged with the slots 166 on the peripheral wall 164 of the rear shield 16. At least one screw 100 is inserted through the screw holes 168 in the rear shield 16, through the side cutouts 150 in the PCB, through the heat sink 26, and into the screw-receiving elements 98 on the optic block 24. It is desirable that two to three screws 100 are affixed in this manner.

The forwardly directed cavity 170 of the rear housing 30 is placed over the rear shield 16, and the mechanically engaging features 172 of the rear housing 30 are snap fit to engage with the corresponding engagement feature 174 of the heat sink 26. The mounting member 32 may be installed in the rear housing 30 prior to assembly.

Referring now to FIGS. 9-17, an exemplary embodiment of a display mirror assembly 310 is disclosed. The display mirror assembly 310 may comprise various elements similar to the display mirror assembly 10. Accordingly, similar elements, components, and sub-assemblies of the display mirror assembly 10 and the display mirror 310 may be utilized alone or in combination to provide for numerous variations of the exemplary display mirror assemblies 10 and 310 without departing from the spirit of the disclosure. Additionally, a toggle mechanism similar to the toggle mechanism 202 may be configured to move or adjust the angular position of a glass element 312 of the display mirror assembly 310.

Referring back to FIG. 5, the display mirror assembly 310 may comprise various like components that may be similar to those discussed in reference to the display mirror assembly 10. For example, as shown in FIG. 4, the display mirror assembly may comprise a partially reflective or partially transmissive element 312 (also referred to as a "glass element" herein) and a display module 318. The display mirror assembly 310 may further include a display module 318 which may further include a display 322, an optic block 324, and a primary PCB 328. The primary PCB 328 as well as various components in connection therewith may be connected to a rear shield 316. The rear shield 316 may correspond to a structural support or mounting bracket configured to provide a stable mounting surface for various components of the display mirror assembly 310.

Referring to FIGS. 9, 10, 11, 12A, 12B, 13A, and 13B, various components of the display module 318 are shown. The description of such elements may be discussed in accordance with an assembly sequence. As such, FIGS. 9-28 may demonstrate at least one reasonable assembly sequence. An edge-lit PCB 420 may comprise a plurality of apertures 330 configured to connect with an upper portion 330 of a perimeter wall 332 of the rear shield 316 via a plurality of fasteners. The edge-lit PCB 420 may comprise a plurality of light emitting diodes (LEDs) configured to illuminate the optic block 324 of the display 322.

Figure 12A:
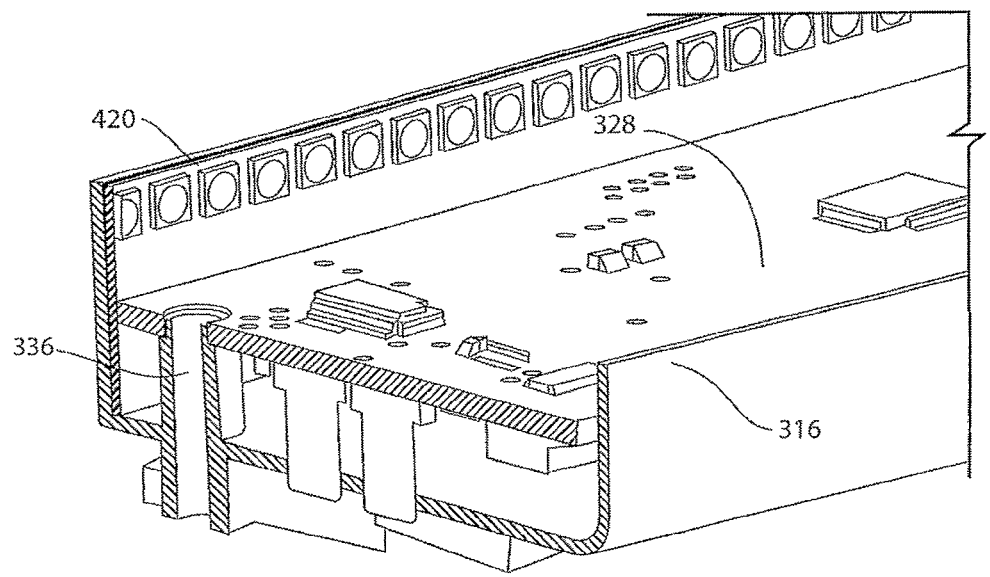
FIG. 12A is a projected cross-sectional view of a rear shield connected to an edge-lit PCB and a primary PCB.
Figure 12B:
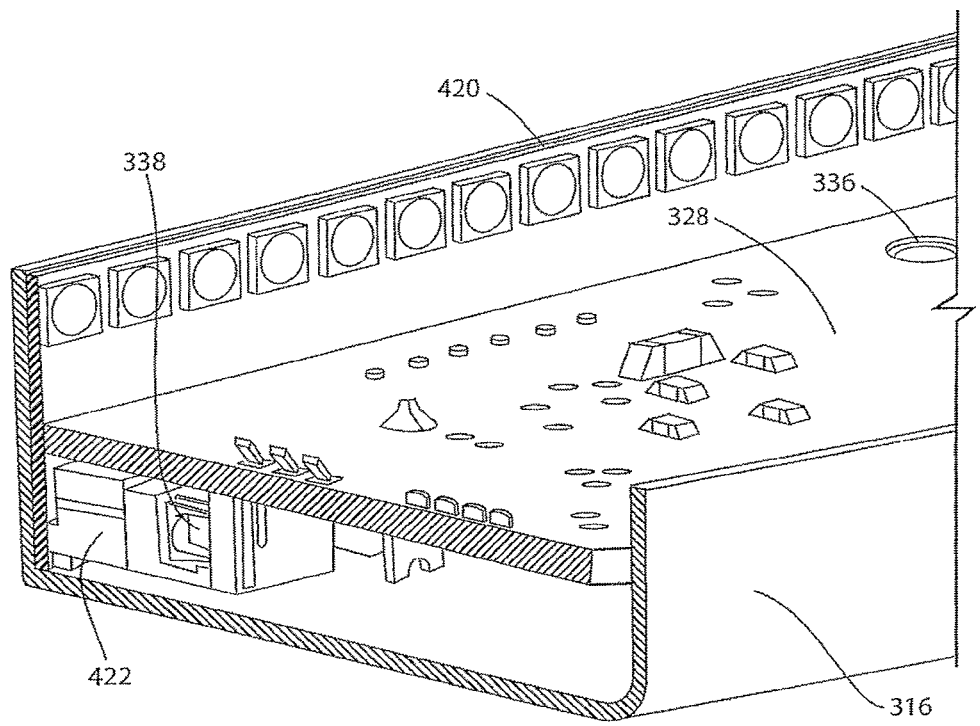
FIG. 12B is a projected cross-sectional view of the rear shield connected to an edge-lit PCB and a primary PCB.
Figure 12C:
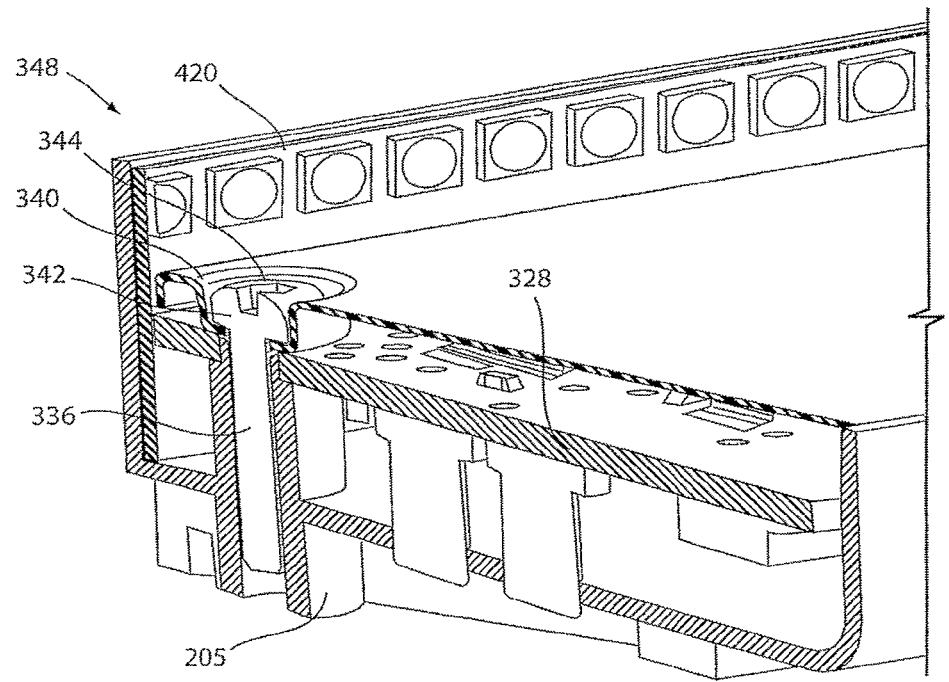
FIG. 12C is a projected cross-sectional view of the rear shield connected to an edge-lit PCB, a primary PCB and an intermediate shield.

The rear shield 316 may be configured to receive the primary PCB 328. The primary PCB 328 may be mounted to the rear shield 316 a plurality of standoffs 336, one of which is shown in cross-section A-A of the rear shield 316 and the primary PCB 328 in FIG. 12A. Additionally as illustrated in FIG. 12B, the primary PCB 328 may align with and communicatively connect with a communication interface 422 of the edge-lit PCB 328 as shown in cross-section B-B. The primary PCB 328 may comprise a spring connector 338 configured to mate with the communication interface 422 via a spring connection. In this configuration, the primary PCB 328 may be efficiently assembled with the edge-lit PCB 328 to provide for expedient and cost-effective assembly of the display module 318.

The display module 318 may further comprise an intermediate shield 340. The intermediate shield 340 may be disposed proximate and substantially parallel to the primary PCB 328. In this configuration, the intermediate shield 340, the primary PCB 328, and the rear shield 316 may form a substantially co-planar assembly that may be connected via a plurality of fasteners 342. The fasteners 342 may extend through apertures 344 in the intermediate shield 340, and through apertures 346 formed by the primary PCB 328. The fasteners 342 may continue to extend through standoffs 348 configured to space the primary PCB 328 from the rear shield 316 and connect with the apertures 239 of the housing 205 of the positioning assembly 206.

The assembled configuration of the intermediate shield 340, the primary PCB 328, and the rear shield 316 and the housing 205 may be referred to as a first stacked sub-assembly 348. The first stacked sub-assembly 348 may be assembled efficiently held together by tension applied by the fasteners 342 extending from the apertures 344 in the intermediate shield 340 to the housing 205. The fasteners may be of conductive material configured to ground at least one of the intermediate shield 340, and the primary PCB 328 to the rear shield 316. In this configuration, each of the rear shield 316 and the intermediate shield may be of substantially heat conductive and electrically conductive materials that may further provide structural support for the first stacked sub-assembly 348.

Figure 12D:
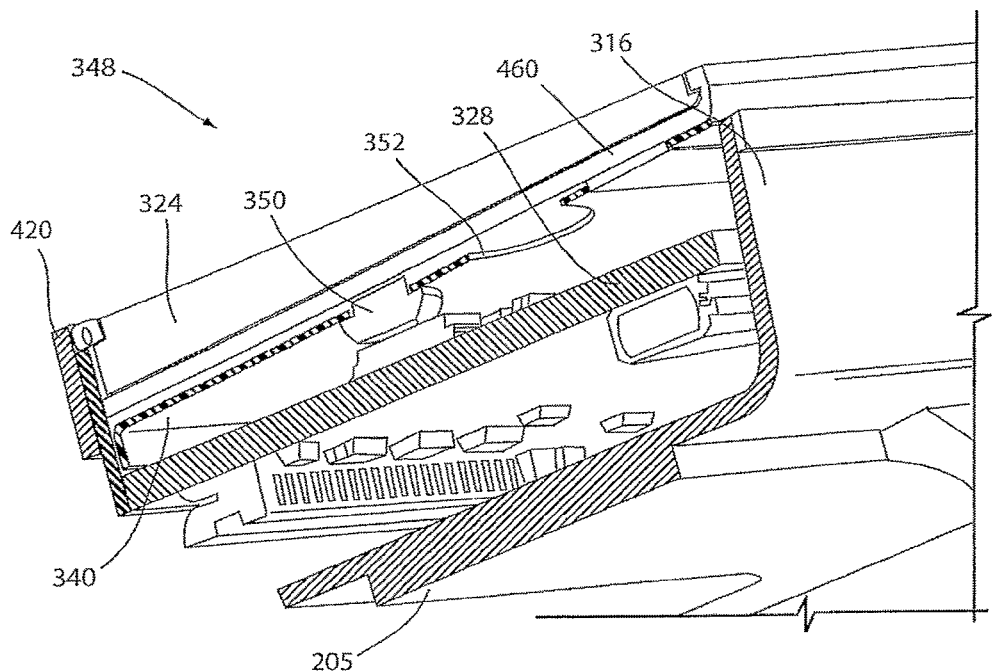
FIG. 12D is a projected cross-sectional view of the rear shield connected to an edge-lit PCB, a primary PCB, an intermediate shield, and an optic block.
Figure 13A:
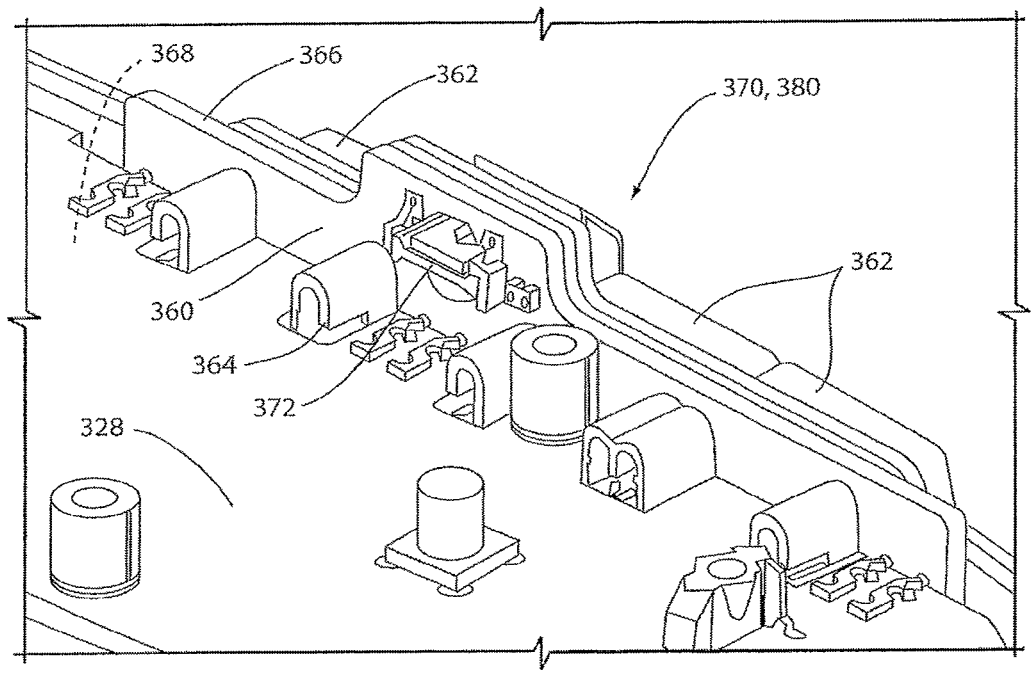
FIG. 13A is a projected view of a daughter board in connection with a primary PCB.
Figure 13B:
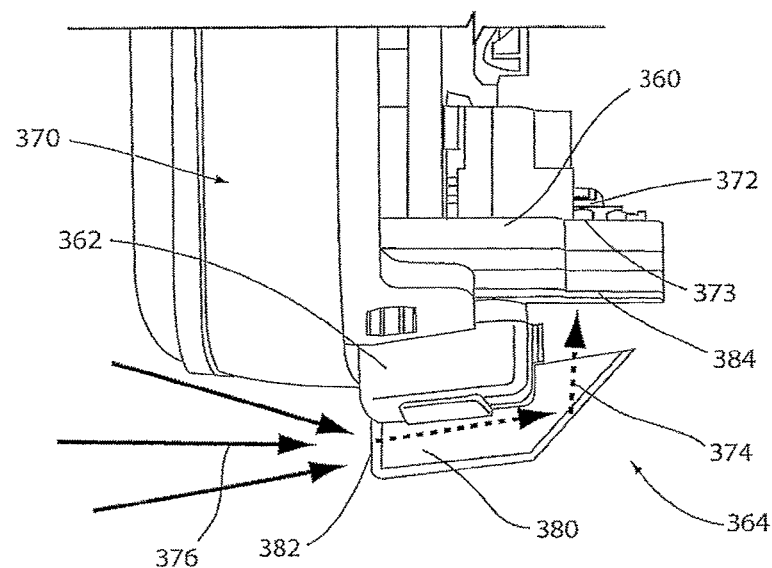
FIG. 13B is a projected view of a daughter board in connection with a primary PCB.
Figure 13C:
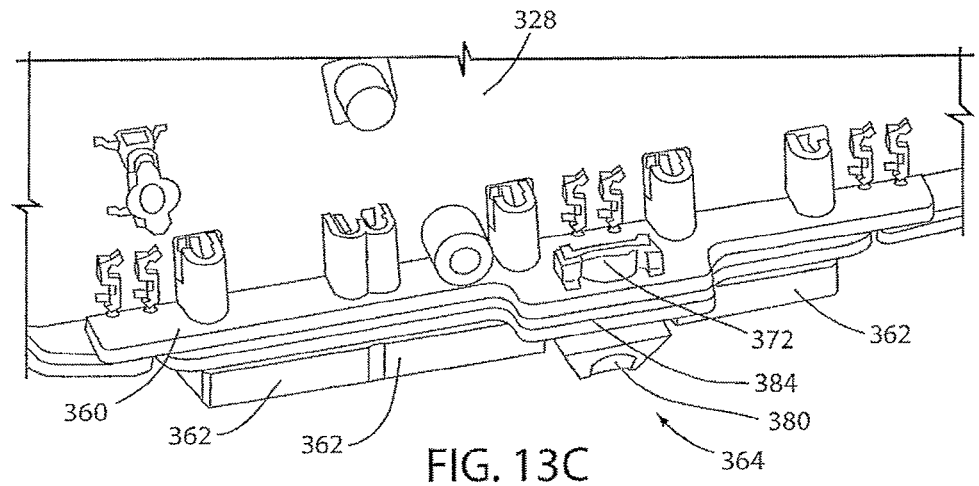
FIG. 13C is a projected view of a daughter board demonstrating a light sensor.
Figure 13D:
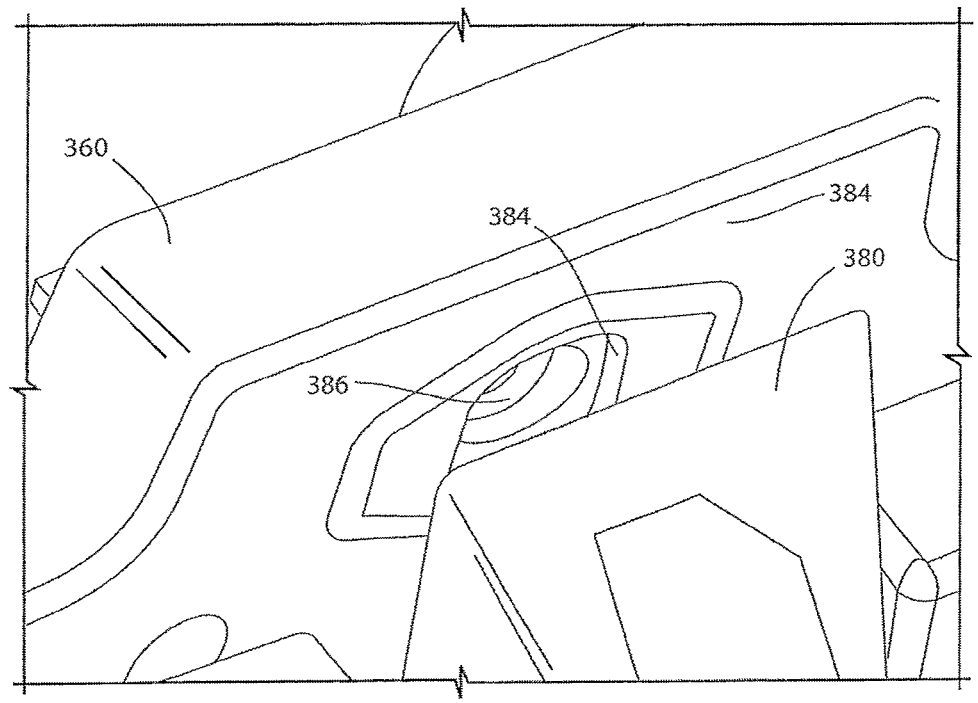
FIG. 13D is a projected view of a daughter board demonstrating a seal of the light sensor.

Referring now to FIG. 12D, the display module 318 may further include a display 322 comprising the optic block 324. The optic block 324 is comprises locating feature 350 configured to slidably engage a locating aperture 352. The locating feature 350 provides for the optic block 324 to drop into the intermediate shield 340 and locate laterally with the first stacked sub-assembly 348. The optic block 324 may be configured to receive light from the plurality of LEDs of the edge-lit PCB 420. The optic block 324 may distribute the light substantially over the display 322 in an edge-lit configuration.

Referring now to FIGS. 13A, 13B, 13C, and 13D, a daughter board 360 may be in electrical and mechanical connection with primary PCB 328 of the display module 318. The daughter board may correspond to a PCB mounted approximately perpendicular to the primary PCB 328. The daughter board 360 comprises a plurality of inputs 362 and an optic sensor 364. This configuration provides for the inputs 362 and the optic sensor 364 to be disposed on a first surface 366 substantially perpendicular to an outer surface 368 the glass element 312.

The inputs 362 may correspond to electrical or electro-mechanical switches configured to receive and communicate inputs to control one of more accessories and/or electrical devices incorporated in the display mirror assembly 310. In an exemplary implementation, the inputs may correspond to three buttons that may be located along an outer perimeter 370 or side portion of the display mirror assembly 310. The inputs 362 may be configured to provide a user interface for one or more controls associated with the display mirror assembly 310. The inputs 362 may be of an elastomeric material configured to form a portion of an outer surface of the display mirror assembly.

The optic sensor 364 may comprise a light sensor 372 having a receptor surface 373 directed in a first direction 374 perpendicular to the daughter board 360 and parallel to the primary PCB 328. The optic sensor may be configured to receive light substantially along a second direction 376 perpendicular to the first direction 374. The light received in the second direction 376 may correspond to a glare light received in the vehicle in the direction of the passenger compartment. The optic sensor 364 may comprise an optic device 380 configured to capture the light in the second direction 376 and redirect the light in the first direction light 374. In this configuration, the optic device 380 may efficiently detect light impinging upon a receiving surface 382 of the optic device 380.

In some implementations, the optic sensor 364 may comprise a seal 384 disposed substantially around a diffuser 385 disposed between the optic device 380 and the receptor surface 373. The seal 384 or boot may form a light receiving aperture 386. The light receiving aperture 386 may be configured to receive the light in the first direction 374 received from the optic device 380. The seal 384 may substantially limit light from entering the optic sensor 364 that is not transmitted through the optic device 380. In this configuration, the optic sensor 364 is operable to efficiently detect light in the second direction 376 while filtering light from being received from other directions. Though the second direction 376 is described herein as corresponding to light passing through the passenger compartment, the optic device 380 may be oriented to receive light from a variety of directions that may be substantially oriented along an operating surface of the vehicle.

Referring now to FIGS. 14A, 14B, 14C, and 14D, a second stacked sub-assembly 452 is shown. The second stacked sub-assembly may be configured to connect to the first stacked sub-assembly 348 for efficient assembly of the display mirror assembly 310. The second stacked sub-assembly may comprise the display 322 disposed in a perimeter 454 of a bezel 456. The display 322 is positioned relative the perimeter 454 via a plurality of at least partially flexible elastomeric spacers 458. The spacers 458 position the display substantially centered in the perimeter 454. The spacers 458 further provide for ease of manufacturing of the second stacked sub-assembly 452.

The second stacked sub-assembly 452 may be assembled to the first stacked sub-assembly 348 and position the display 322 in an optic tray 460 configured to receive the optic block 324. The primary PCB 28 may be connected to the display 322 via flexible electrical connector 480. The rear shield 316 may form an opening 462 disposed substantially centrally and proximate the upper portion 330 of a perimeter wall 332. The flexible connector 480 may be configured to provide a conductive connection between the primary PCB 328 and the display 322 by passing through the opening 462. In this configuration, the rear shield 316 may provide for efficient heat transfer from the edge-lit PCB 420 substantially along the entire length L of the rear shield 316. In this configuration, the first stacked sub-assembly 348 and the second stacked sub-assembly 452 may be efficiently assembled.

The first stacked sub-assembly 348 and the second stacked sub-assembly 452 may be connected via a plurality of fasteners 482. The plurality of fasteners 482 may be disposed in proximate the perimeter 454 of the bezel 456. In an exemplary embodiment, two of the fasteners 482 may be disposed in an upper portion 484 along the perimeter and another may be disposed in a lower portion 486. With the first stacked sub-assembly 348 and the second stacked sub-assembly 452 connected, the display mirror assembly 310 may be connected to a test terminal via a connector 490 in communication with the primary PCB 328. In this way, the display mirror assembly 310 may be tested for functionality and may be reworked by removing the fasteners 482 to access various portions of the first stacked sub-assembly 348 or the second stacked sub-assembly 452.

In the assembled configuration, the optic block 324 may be configured to receive light from the plurality of LEDs of the edge-lit PCB 420. The optic block 324 may distribute the light substantially over the display 322 in an edge-lit configuration. The glass element 312 may be positioned proximate an outermost portion of the display 322. In this configuration, the glass element 312 may correspond to the partially reflective or partially transmissive element 312 and may provide for the reflected line of sight for the first position 220 and the second position 222 as discussed herein.

Figure 15:
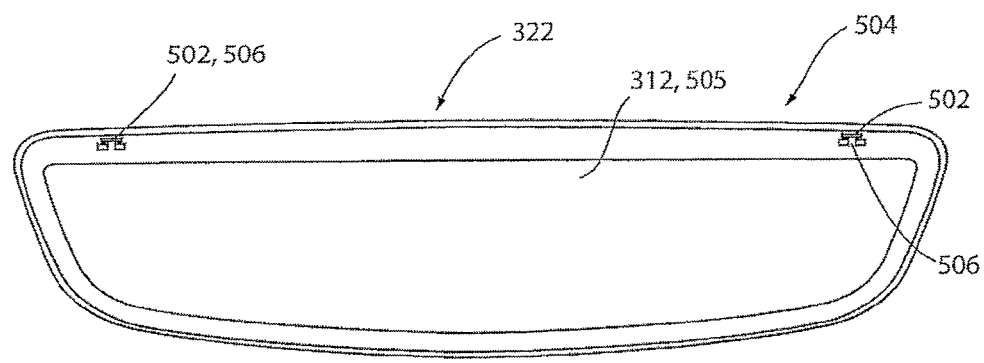
FIG. 15 is a front view of a display.

Referring now to FIG. 15, the display 322 is shown demonstrating a plurality of terminals 502 located proximate an upper edge portion 504 of the glass element 312. The terminals may be configured to provide one or more signals to an electro-optic element 505 of the glass element 312. The terminals are positioned such that a j-clip 506 may interconnect the terminals 502 with the primary PCB 328 via a conductor element 504. In this configuration, the terminals may efficiently be in conductive communication with the primary PCB 328. At least one of the conductor elements 504 are illustrated in a cross-sectional assembled view of an upper portion of the display mirror assembly 310 as shown in FIG. 16B.

Figure 16A:
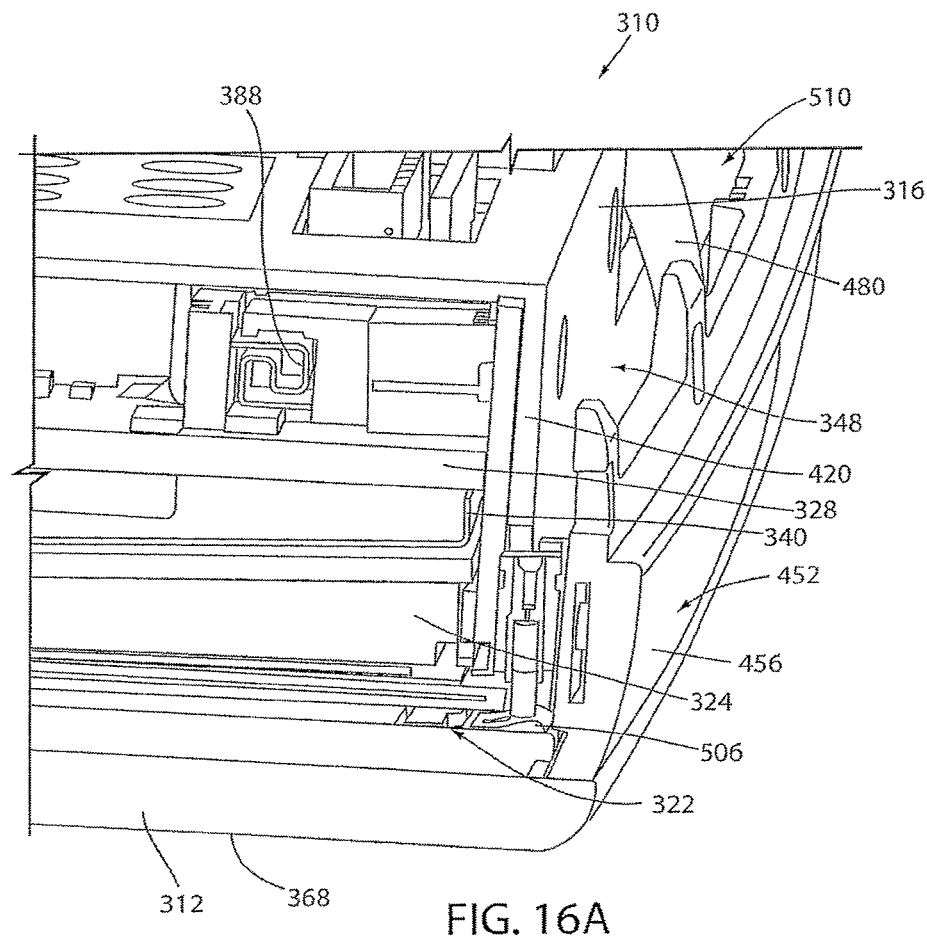
FIG. 16A is a partial cross-sectional view of a display mirror assembly.
Figure 16B:
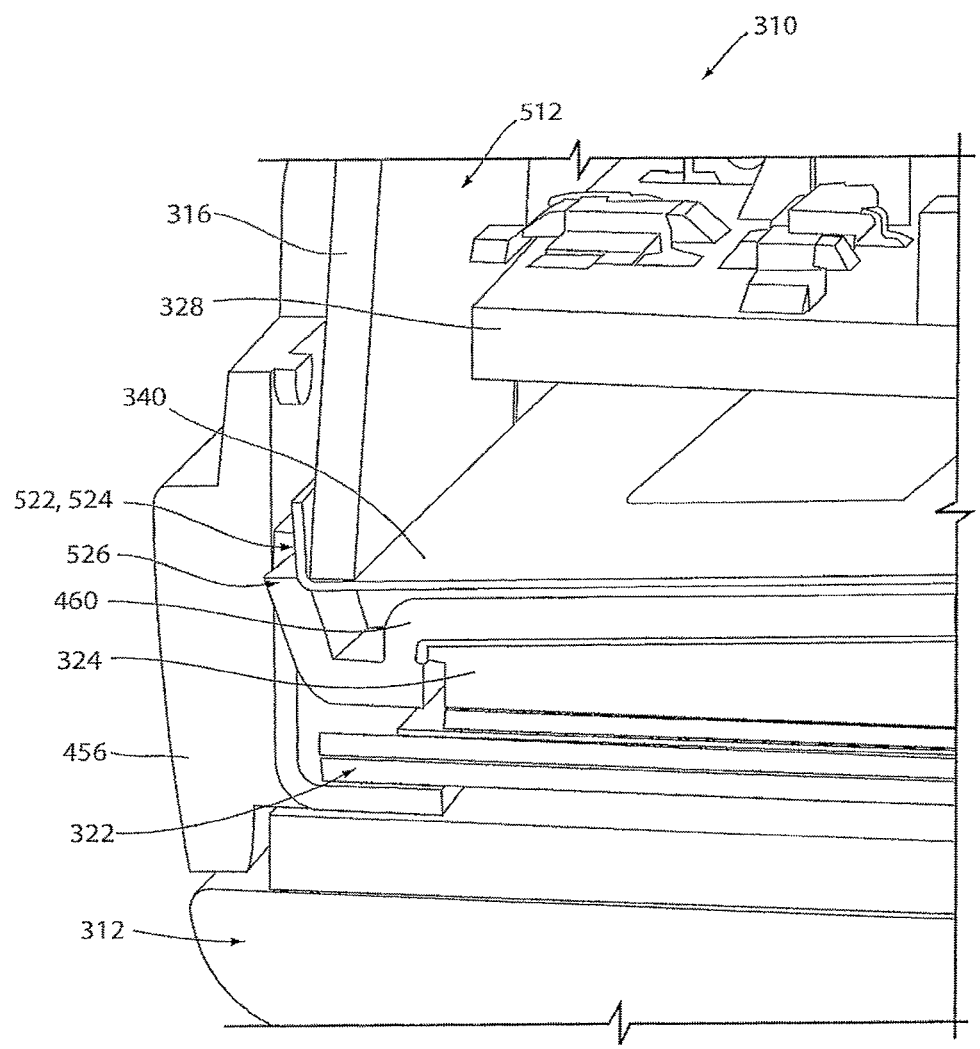
FIG. 16B is a partial cross-sectional view of a display mirror assembly.

Referring now to FIGS. 16A and 16B, cross-sectional views of an upper portion 510 of the and a lower portion 512 of the display mirror assembly 310 are shown, respectively. FIGS. 16A and 16B demonstrate an at least partially assembled view of the first stacked sub-assembly 348 and the second stacked sub-assembly 452. As shown, the first stacked sub-assembly 348 is shown demonstrating the stacked configuration of the intermediate shield 340, the primary PCB 328, and the rear shield 316 and the housing 205. The second stacked sub-assembly 452 is shown demonstrating the stacked configuration of the display 322 and the glass element 312 disposed in a perimeter 454 of a bezel 456.

In the assembled configuration, the edge-lit PCB 420 is mounted to the rear shield 316 and provides for the connection of the conductor element 504 via the j-clip 506. The spring connector 338 is also shown connecting the primary PCB 328 to the edge-lit PCB 420. In this configuration, the electro-optic element 505 and the edge-lit PCB 420 may be in communication with the primary PCB 328 based on the connections that are engaged during an assembly operation via the spring connections discussed herein.

A ground connection 522 is shown between the intermediate shield 340 and the rear shield 316 via a fold over connection 524. The optic tray 460 also comprises a fold over connection 526. As described herein, the display mirror assembly 310 may correspond to an assembly configured for efficient assembly and testing due to the robust nature of the various components and connections described herein. The implementations of the display mirror assemblies 10 and 310 are significantly independently herein for clarity. However, it shall be understood that the various components, connections, and arrangement discussed herein may be used in various combinations without departing from the spirit of the disclosure.

Figure 14A:
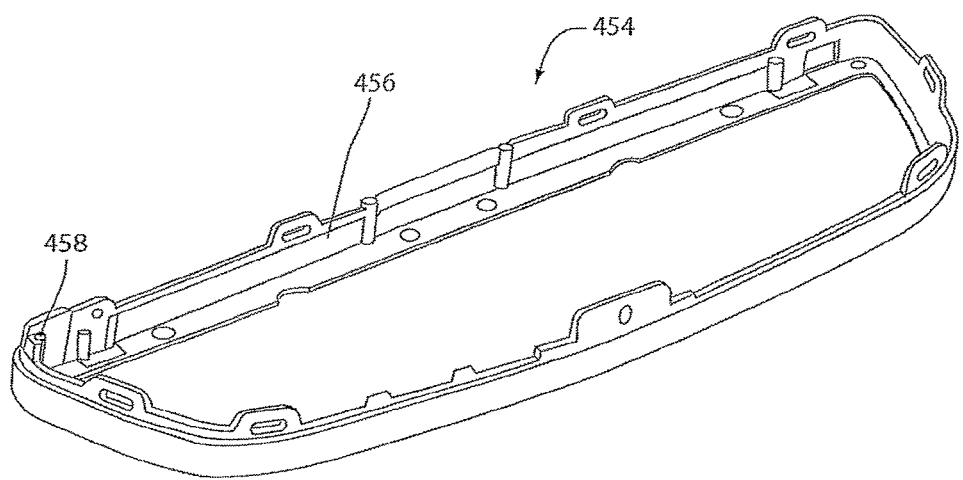
FIG. 14A is a projected view of a bezel of a second stacked sub-assembly.
Figure 14B:
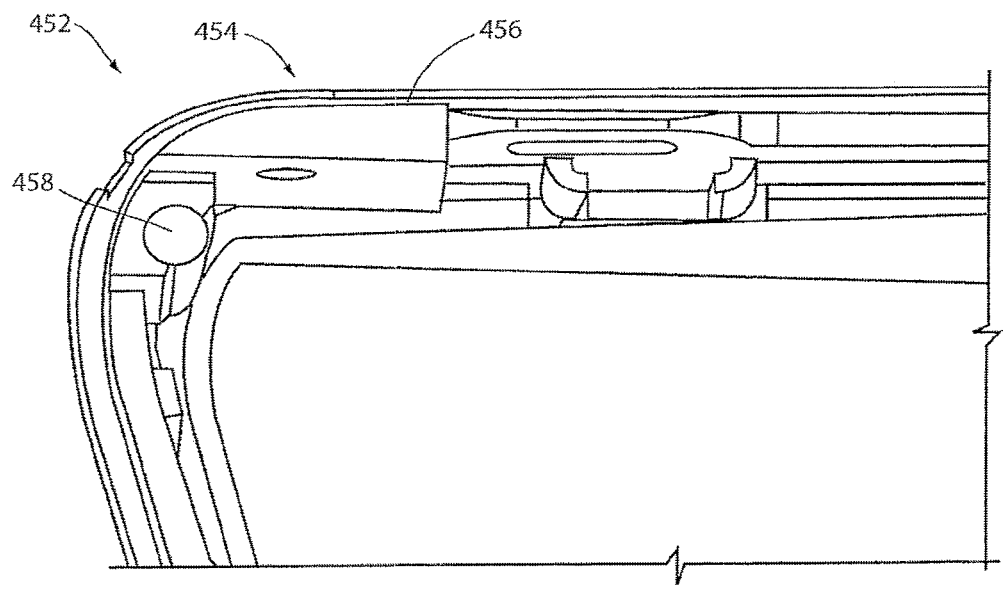
FIG. 14B is a projected view of the second stacked sub-assembly.
Figure 14C:
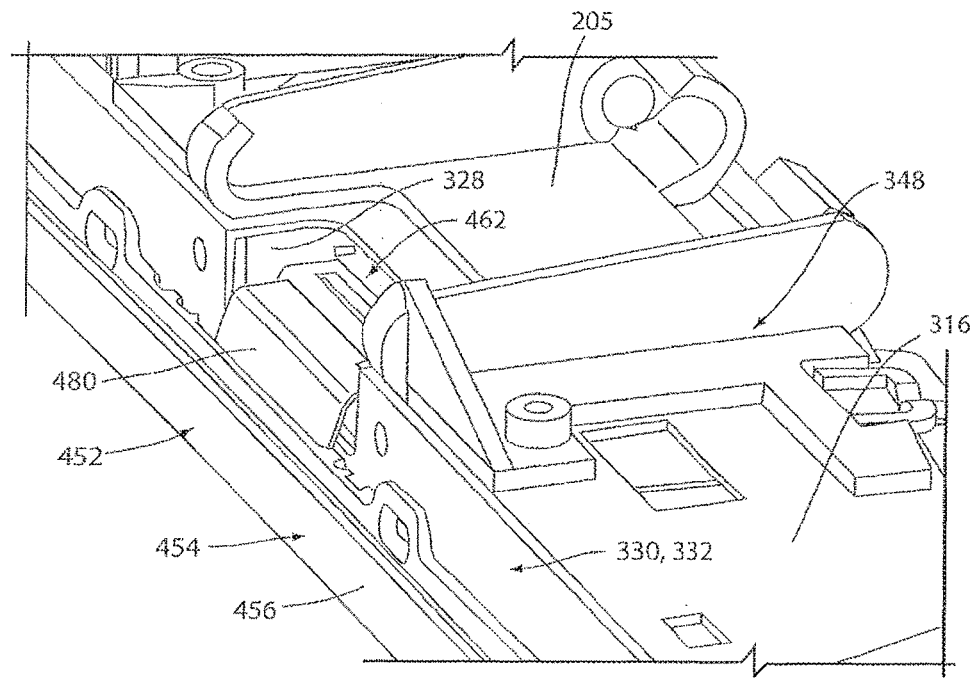
FIG. 14C is a projected view of a first stacked subassembly and a second stacked sub-assembly.
Figure 14D:
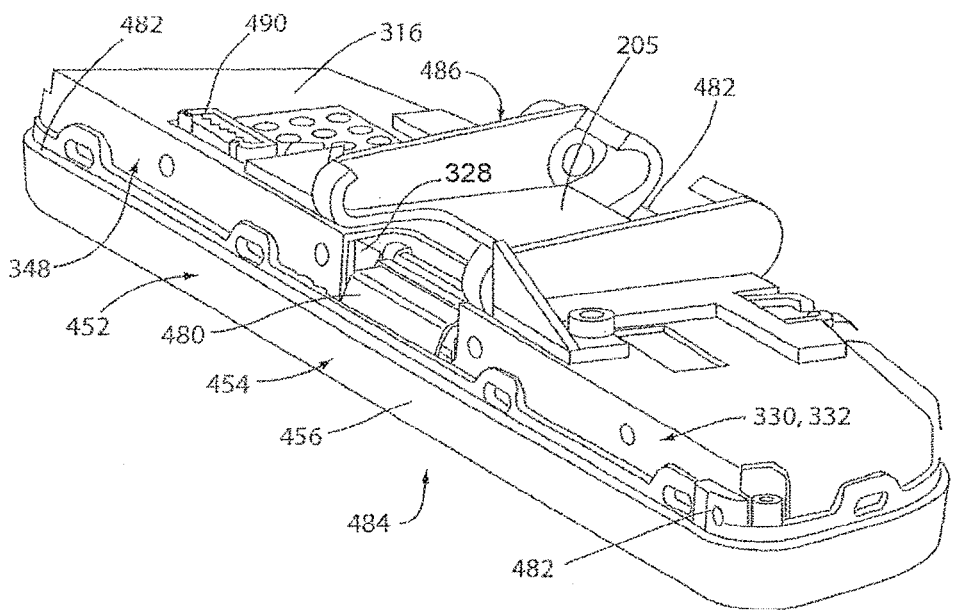
FIG. 14D is a projected view of a first stacked subassembly and a second stacked sub-assembly.
Figure 17:
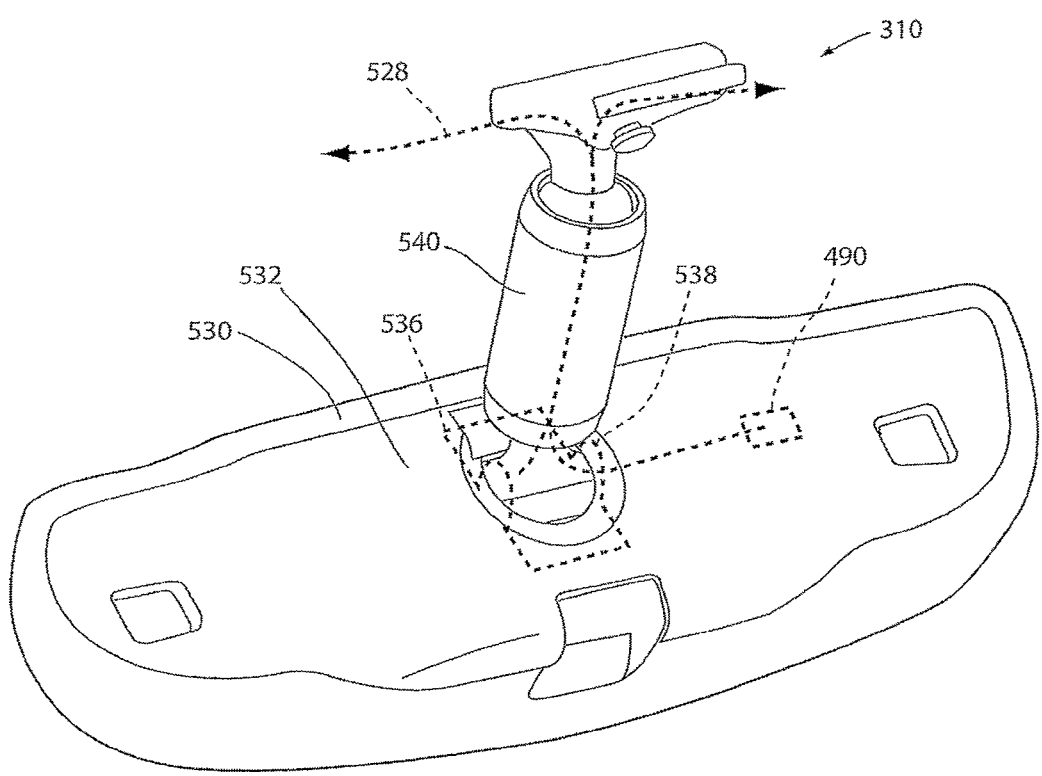
FIG. 17 is a projected and partially transparent view of the display mirror assembly in accordance with the disclosure.

Referring now to FIG. 17, a projected view of the display mirror assembly 310 is shown demonstrating a wire path configured to provide for electrical communication from the various electrical components of the display mirror assembly 310 (e.g. the primary PCB 328) to the vehicle. As shown by the hidden lines, a communication interface 528 may be connected to the a connector 490, which may be in communication with the primary PCB 328. The communication interface 528 may be connected to the connector 490 prior to the connection of a rear housing 530 and a rear cover 532. The assembly without the rear housing 530, the rear cover 532, and the mounting assembly 534, which may correspond to a ball and socket bracket, is shown in FIG. 14D. As such, a communication interface may be connected with the connector 490, then routed through the mounting assembly 534 prior or as an intermediate step corresponding to connecting the mounting assembly 534. In this way, efficient assembly is further provided for by the display mirror assembly 310.

As demonstrated in FIG. 17, the communication interface 528 is shown extending from the connector 490 through a first passage 536 formed by a connecting bracket 538 of the mounting assembly 534. The first passage 536 may connect with a second passage 540 formed by a body of the mounting assembly 534. In this configuration, the connecting bracket 538 and the mounting assembly 534 may provide for the communication interface to be routed through the and the first passage 536 and the second passage 540 to provide for communication between the display mirror assembly 310 and the vehicle.

The present disclosure may be used with a mounting system such as that described in U.S. Pat. Nos. 8,814,373; 8,201,800; 8,210,695; 8,925,891; 9,174,577; and 9,838,653; and U.S. Provisional Patent Application Nos. 61/709,716; 61/707,676; and 61/704,869, which are hereby incorporated herein by reference in their entirety. Further, the present disclosure may be used with a rearview packaging assembly such as that described in U.S. Pat. Nos. 8,814,373; 8,646, 924; 8,643,931; 8,264,761; and 8,885,240; and U.S. Provisional Patent Application Nos. 61/707,625; and 61/590,259, which are hereby incorporated herein by reference in their entirety. Additionally, it is contemplated that the present disclosure can include a bezel such as that described in U.S. Pat. Nos. 8,827,517; 8,210,695; and 8,201,800, which are hereby incorporated herein by reference in their entirety.

A display mirror assembly according to the present disclosure has several advantages. The display module is supported by the front shield and rear shield, and does not require a separate support or carrier plate. Omission of a carrier plate, and inclusion of retaining features in the front shield and rear shield, permits the display mirror assembly to be lighter, involve less parts for manufacturing, and to have a display which is viewable over a larger percentage of the total viewing area of the display mirror assembly.

It will be appreciated that embodiments of the invention described herein may be comprised of one or more conventional processors and unique stored program instructions that control one or more processors to implement, in conjunction with certain non-processor circuits, some, most, or all of the functions of a display mirror assembly 10, as described herein. The non-processor circuits may include, but are not limited to signal drivers, clock circuits, power source circuits, and/or user input devices. As such, these functions may be interpreted as steps of a method used in using or constructing a classification system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, the methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

It will be understood by one having ordinary skill in the art that construction of the described invention and other components is not limited to any specific material. Other exemplary embodiments of the invention disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A display mirror assembly for a vehicle, comprising:
   a display device defining a display surface having a display perimeter elongated along a length;
   a primary PCB in communication with the display device, the primary PCB comprising a first side and an opposing second side, wherein the first side is directed toward the display device;
   a heat sink in connection with the second side of the primary PCB and extending substantially coextensive with the length display perimeter; and
   a lighting module extending along the length of the display device, wherein the lighting module extends substantially perpendicular to the first side of the primary PCB and is configured to direct edge lighting substantially parallel to the first side of the primary PCB.

2. The display mirror assembly according to claim 1, wherein the primary PCB further comprises a first longitudinal edge and a second longitudinal edge substantially aligned with the length of the display device.

3. The display mirror assembly according to claim 2, wherein the heat sink forms an aperture configured to pass a connector therethrough, wherein the connector is configured to transmit between the primary PCB and the display device.

4. The display mirror assembly according to claim 3, wherein the aperture is located proximate the first longitudinal edge.

5. The display mirror assembly according to claim 1, wherein the lighting module corresponds to a secondary PCB comprising a plurality of light sources configured to emit edge lighting to illuminate the display device.

6. The display mirror assembly according to claim 1, further comprising an optic block disposed in an optic tray.

7. The display mirror assembly according to claim 6, wherein the optic tray forms a barrier layer between the primary PCB and the optic block.

8. The display mirror assembly according to claim 6, wherein the optic block is configured to receive the edge lighting along the length of the display device.

9. A display mirror assembly for a vehicle, comprising:
   a display device comprising an optic tray and an optic block defining a display surface having a display perimeter elongated along a length;
   a primary PCB in communication with the display device, the primary PCB comprising a first side and an opposing second side, wherein the first side is directed toward the display device;
   a lighting module configured to project light along the length of the optic block and substantially parallel to the display surface;
   a heat sink in connection with the second side of the primary PCB;
   a light sensor in connection with the primary PCB; and
   an optic device configured to receive light from a second direction substantially normal to the display surface and transmit the light to the light sensor in a first direction substantially parallel to the display surface.

10. The display mirror assembly according to claim 9, further comprising a mounting bracket in connection with the heat sink opposite the primary PCB, wherein the mounting bracket is configured to engage a mounting assembly configured to connect to a windshield.

11. The display mirror assembly according to claim 10, wherein the heat sink is configured to structurally support the display mirror assembly via the connection with the mounting bracket.

12. The display mirror assembly according to claim 10, further comprising a housing configured to substantially enclose the heat sink and the mounting bracket, wherein the optic device extends through a portion of the housing.

13. The display mirror assembly according to claim 12, wherein the light sensor is disposed on an auxiliary circuit board in connection with the primary PCB and configured to receive light in the first direction substantially parallel to the display surface.

14. A display mirror assembly for a vehicle, comprising:
   a display device comprising an optic block defining a display surface having a display perimeter elongated along a length;
   a primary PCB in communication with the display device, the primary PCB comprising a first side and an opposing second side, wherein the first side is directed toward the display device;
   a heat sink in connection with the second side of the primary PCB; and
   an intermediate shield extending substantially co-extensively with the optic block and disposed between the display device and the primary PCB.

15. The display mirror assembly according to claim 14, wherein the primary PCB further comprises a first longitudinal edge and a second longitudinal edge substantially aligned with the length of the display device.

16. The display mirror assembly according to claim 15, wherein the heat sink forms an aperture configured to pass a connector therethrough, wherein the connector is configured to transmit between the primary PCB and the display device.

17. The display mirror assembly according to claim 16, wherein the aperture is located proximate the first longitudinal edge.

18. The display mirror assembly according to claim 14, wherein the optic block is disposed in an optic tray.

19. The display mirror assembly according to claim 18, wherein the optic tray forms a barrier layer between the primary PCB and the optic block.

20. The display mirror assembly according to claim 18, wherein the optic block is configured to receive edge lighting along the length of the display device.

* * * * *